United States Patent
Siddiqui et al.

(10) Patent No.: US 10,979,018 B1
(45) Date of Patent: Apr. 13, 2021

(54) FOCUSING TRANSFORMERS/FILTERS IN ISOTROPIC/ANISOTROPIC PIEZOELECTRICS

(71) Applicant: National Technology & Engineering Solutions of Sandia, LLC, Albuquerque, NM (US)

(72) Inventors: Aleem Siddiqui, Albuquerque, NM (US); Matt Eichenfield, Albuquerque, NM (US); Benjamin Griffin, Arlington, VA (US); Christopher Nordquist, Albuquerque, NM (US)

(73) Assignee: National Technology & Engineering Solutions of Sandia, LLC, Albuquerque, NM (US)

( * ) Notice: Subject to any disclaimer, the term of this patent is extended or adjusted under 35 U.S.C. 154(b) by 84 days.

(21) Appl. No.: 16/558,453

(22) Filed: Sep. 3, 2019

(51) Int. Cl.
*H03H 9/145* (2006.01)
*H03H 9/64* (2006.01)
*H03H 9/02* (2006.01)
*H03H 9/25* (2006.01)

(52) U.S. Cl.
CPC .... *H03H 9/14544* (2013.01); *H03H 9/02559* (2013.01); *H03H 9/02637* (2013.01); *H03H 9/25* (2013.01); *H03H 9/64* (2013.01)

(58) Field of Classification Search
CPC .. H03H 9/14544; H03H 9/64; H03H 9/02559; H03H 9/02637; H03H 9/25
USPC ................................ 333/186–188, 193–196
See application file for complete search history.

(56) References Cited

U.S. PATENT DOCUMENTS

2013/0321100 A1* 12/2013 Wang .................... H01L 41/107
333/187

OTHER PUBLICATIONS

Cassella, C. et al., "Aluminum Nitride Cross-Sectional Lamé Mode Resonators," Journal of Microelectromechanical Systems (2016) 25(2):275-285.
Chan, J. et al., "Laser cooling of a nanomechanical oscillator into its quantum ground state," Nature (2011) 478:89-92.
Chen, J. J. et al., "Deposition of high-quality zinc oxide thin films on diamond substrates for high-frequency surface acoustic wave filter applications," Thin Solid Films (2005) 485:257-261.
(Continued)

*Primary Examiner* — Robert J Pascal
*Assistant Examiner* — Jorge L Salazar, Jr.
(74) *Attorney, Agent, or Firm* — Mark A. Dodd

(57) ABSTRACT

A focusing interdigital transducer (IDT) and corresponding single- and dual-port piezoelectric devices are disclosed. The focusing interdigital transducer, which generates Lamé acoustic waves, permits operation at significantly higher frequencies than those possible with traditional IDTs. The focusing IDT employs multiple arced fingers formed both above and below the piezoelectric layer to improve coupling efficiency by coupling through both the $e_{31}$ and $e_{33}$ piezoelectric coefficients to the piezoelectric layer. By optimizing both anchor design and location, acoustic wave losses are minimized, thereby improving the device's quality factor Q. Through proper bus design and selection of the number of IDT fingers, a device's impedance can be tuned for a given application. The focusing IDTs may be used in single-port filter devices and dual-port transformer devices. The single- and dual-port devices may operate at a single frequency, at two frequencies, or over a band of frequencies.

20 Claims, 12 Drawing Sheets

(56) References Cited

OTHER PUBLICATIONS

Eichenfield, M. et al., "Optomechanical crystals," Nature (2009) 462:78-82.
Hatanaka, D. et al., "Phonon waveguides for electromechanical circuits," Nature Nanotechnology (2014) 9:520-524.
Lakin, K. et al., "High-Q Microwave Acoustic Resonators and Filters," IEEE Transactions on Microwave Theory and Techniques (1993) 41(12):2139-2146.
Lin, C.-M. et al., "Micromachined One-Port Aluminum Nitride Lamb Wave Resonators Utilizing the Lowest-Order Symmetric Mode," Journal of Microelectromechanical Systems (2014) 23(1):78-91.
Lu, M.-H. et al., "Phononic crystals and acoustic metamaterials," Materials Today (2009) 12(12):34-42.
Mohammadi, S. et al., "High-Q micromechanical resonators in a two-dimensional phononic crystal slab," Applied Physics Letters (2009) 94:051906, 3 pages.
Mohammadi, S. et al., "Waveguide-Based Phononic Crystal Micro/Nanomechanical High-Q Resonators," Journal of Microelectromechanical Systems (2012) 21(2):379-384.
Olsson, III, R. H. et al., "Ultra High Frequency (UHF) Phononic Crystal Devices Operating in Mobile Communication Bands," 2009 IEEE International Ultrasonics Symposium Proceedings, Rome, Italy, Sep. 20-23, pp. 1150-1153.
Otsuka, P. H. et al., "Broadband evolution of phononic-crystal-waveguide eigenstates in real- and k-spaces," Scientific Reports (2013) 3:3351, 5 pages.
Shin, H. et al., "Control of coherent information via on-chip photonic-phononic emitter-receivers," Nature Communications (2015) 6:6427, 8 pages.
Shin, H. et al., "Tailorable stimulated Brillouin scattering in nanoscale silicon waveguides," Nature Communications (2013)4:1944, 10 pages.
Siddiqui, A. et al., "Lamb Wave Focusing Transducer for Efficient Coupling to Wavelength-Scale Structures in Thin Piezoelectric Films," Journal of Microelectromechanical Systems (2018) 27(6):1054-1070.
Wang, L. et al., "Embedded Nanotransducer for Ultrahigh-frequency SAW Utilizing AlN/Diamond Layered Structure," 2017 Joint IEEE International Symposium on the Applications of Ferroelectric (ISAF)/International Workshop on Acoustic Transduction Materials and Devices (IWATMD)/Piezoresponse Force Microscopy (PFM), Atlanta, GA, May 7-11, 4 pages.
Wang, S. et al., "GAN MEMS Resonator Using a Folded Phononic Crystal Structure," Solid-State Sensors, Actuators and Microsystems Workshop (2014) Hilton Head Island, South Carolina, Jun. 8-12, pp. 72-75.

* cited by examiner

FOCUSING TRANSFORMERS/FILTERS IN ISOTROPIC/ANISOTROPIC PIEZOELECTRICS

STATEMENT OF GOVERNMENT INTEREST

This invention was made with Government support under Contract No. DE-NA0003525 awarded by the United States Department of Energy/National Nuclear Security Administration. The Government has certain rights in the invention.

TECHNICAL FIELD

The present invention relates to transformers and filters formed with isotropic or anisotropic piezoelectric material using focusing interdigital transducers (IDTs) to excite Lame modes within the piezoelectric material.

BACKGROUND

Topology miniaturization and material quality improvements in acoustic wavelength-scale structures has enabled the development of novel phononic and radio frequency (RF) devices. Surface acoustic wave (SAW) device performance has been pushed well into the GHz range and devices have been realized in compact, low-cost material platforms. See L. Wang, et al., "Embedded nanotransducer for ultra-high-frequency SAW utilizing AlN/diamond layered structure," in 2017 Joint IEEE International Symposium on the Applications of Ferroelectric (ISAF)/International Workshop on Acoustic Transduction Materials and Devices (IWATMD)/Piezoresponse Force Microscopy (PFM), pp. 106-109 (2017); J. J. Chen, et al., "Deposition of high-quality zinc oxide thin films on diamond substrates for high-frequency surface acoustic wave filter applications," Thin Solid Films, vol. 485, no. 1, pp. 257-261 (2005); K. M. Lakin, et al., "High-Q microwave acoustic resonators and filters," IEEE Trans. Microwave Theory Tech., vol. 41, no. 12, pp. 2139-2146 (1993), each of which is incorporated herein by reference.

Phononic crystal waveguides and cavities have been demonstrated at higher frequencies and with increasingly higher quality factors. See S. Mohammadi, et al., "High-Q micromechanical resonators in a two-dimensional phononic crystal slab," Appl. Phys. Lett., vol. 94, no. 5, p. 051906 (2009); P. H. Otsuka, et al., "Broadband evolution of phononic-crystal-waveguide eigenstates in real- and k-spaces," Sci. Rep., vol. 3 (2013); D. Hatanaka, et al., "Phonon waveguides for electromechanical circuits," Nat. Nanotechnol., vol. 9, no. 7, pp. 520-524 (2014); S. Mohammadi and A. Adibi, "Waveguide-Based Phononic Crystal Micro/Nanomechanical High-Resonators," J. Microelectromechanical Syst., vol. 21, no. 2, pp. 379-384 (2012), each of which is incorporated herein by reference.

Nano-opto-mechanical devices exploiting strong phonon-photon interactions have led to quantum ground state cooling, phonon lasing and ultra-sensitive sensors and accelerometers. See M. Eichenfield, et al., "Optomechanical crystals," Nature, vol. 462, no. 7269, pp. 78-82 (2009); J. Chan, et al., "Laser cooling of a nanomechanical oscillator into its quantum ground state," Nature, vol. 478, no. 7367, pp. 89-92 (2011); H. Shin, et al., "Tailorable stimulated Brillouin scattering in nanoscale silicon waveguides," Nat. Commun., vol. 4 (2013); H. Shin, et al., "Control of coherent information via on-chip photonic-phononic emitter-receivers," Nat. Commun., vol. 6, p. 6427 (2015), each of which is incorporated herein by reference. These developments and others are expected to have a major impact on applications ranging from signal processing and RF communications, to acoustic imaging and nondestructive testing. See P. J. Shull, "Nondestructive Evaluation: Theory, Techniques, and Applications," CRC Press (2016), which is incorporated herein by reference.

Emerging wavelength-scale devices resulting from this push toward higher frequency and improved functionality often require efficient excitation at the scale of a single wavelength. The size of practical RF piezoelectric transducers, however, is often constrained by RF impedance-matching requirements. See D. Royer and E. Dieulesaint, "Elastic Waves in Solids II: Generation, Acousto-optic Interaction, Applications," Springer Science & Business Media (2000), which is incorporated herein by reference. The electrical admittance of straight interdigital transducers (IDTs), for example, is characterized by a static total capacitance and a radiative conductance proportional to the total capacitance. Impedance matching is optimized through the radiative conductance via the static capacitance. In the gigahertz frequency regime, the IDT beam waist must generally be kept sufficiently large to attain optimal matching to a 50Ω line, especially when matching networks are impractical. Straight IDTs therefore frequently have dimensions many wavelengths long, which are not compatible with a wavelength-scale excitation requirement. Thus, impedance matching considerations essentially guarantee that the power produced by a transducer will be spread over an area much larger than a wavelength and directly result in significant insertion loss on the send or receive transducer or both. R. H. Olsson, et al., "Ultra high frequency (UHF) phononic crystal devices operating in mobile communication bands," in Ultrasonics Symposium (IUS), 2009 IEEE International, pp. 1150-1153 (2009), which is incorporated herein by reference. FIG. 1 illustrates this prior art problem in a transmission configuration involving an acoustical waveguide.

Even if the transducer length was greatly reduced, mode mismatch due to diffraction would still lead to a large insertion loss unless electrodes were directly deposited onto the waveguide, which from both a fabrication and impedance-matching perspective is impractical. The large number of electrodes in this case would also lead to excessively narrow filter bandwidths through increased filter Q factors. IDTs with straight fingers, while optimized to produce straight crested Lamb waves, are ill-suited to serve as an electrical/phononic interface for wavelength scale phononic devices. One solution to this problem is to use large IDTs followed by focusing elements such as reflection from a curved surface or propagation through an acoustical metamaterial with a negative index. See M.-H. Lu, et al., "Phononic crystals and acoustic metamaterials," Mater. Today, vol. 12, No. 12, pp. 34-42 (2009), which is incorporated herein by reference. This approach, however, increases both the device footprint and insertion loss and adds to the complexity of realizing focusing elements for an acoustical beam having a large beam waist.

In spite of these previous efforts, the need still exists for IDT designs and corresponding devices that can bridge the gap between large IDTs for impedance matching and wavelength scale features for high frequency operation and improved functionality.

SUMMARY

One aspect of the present invention relates to a focusing transducer that directly produces a focused Lame wave, as opposed to the prior art's Lamb wave, in a thin piezoelectric layer. The properties of this wave can be tailored to produce acoustical beams matched to a given wavelength scale-device. The focusing transducer employs an interdigital transducer (IDT) with multiple arced fingers. The spacing and width of the arced fingers are a function of several factors, including: the desired operating frequency or wavelength, the distance between the arced finger and the focus, and the angle between the position on the arced finger and the propagation axis. Unlike prior art IDT designs, which employed front surface electrodes and a back-surface floating or ground plane, see C.-M. Lin, et al., "Micromachined One-Port Aluminum Nitride Lamb Wave Resonators Utilizing the Lowest-Order Symmetric Mode," J. Microelectromechanical Systems, vol. 23, no. 1, pp. 78-91 (2014), which is incorporated herein by reference, the focusing transducer in accordance with one aspect of the present invention employs both front and back surface signal electrodes. To the extent the material used to form the piezoelectric layer is anisotropic, the arced fingers are not symmetric about the propagation axis to compensate for this anisotropy. The number of arced fingers is selected to minimize losses due to impedance mismatch.

Another aspect of the present invention relates to a single-port device or filter. This filter employs a single focusing transducer with a phononic reflector at each end. These phononic reflectors need to follow constant phase contours to maximize coupling of the input signal into the desired fundamental symmetric mode, while minimizing coupling into the undesired fundamental sheer horizontal and antisymmetric modes or higher order modes. These symmetric, shear horizontal, and antisymmetric fundamental modes are illustrated in FIGS. 2A-2C, respectively. Proper selection of the focus and beam waist sizes can filter out the undesired higher order modes.

Yet another aspect of the present invention relates to a dual-port device or transformer. This transformer employs two focusing input transducers facing each other with an output transducer located at the focus between the two input transducers. By using focusing input transducers, the transformer achieves a higher step voltage ratio than can be achieved with a prior art straight finger IDT design.

The benefits of the present invention's focusing transducer include one or more of the following depending upon the embodiment and application. Impedance matching on the input side is improved by optimizing the number of arced fingers used. This approach may also reduce the number of fingers used on the output side, thereby reducing the overall size of the device. Compared to the prior art transducer's use of Lamb modes, the present invention's use of Lame modes improves the coupling efficiency ($k_t^2$). For example, while the prior art Lamb mode devices had a coupling efficiency of approximately 2%, the present invention Lame mode devices may have a coupling efficiency as high as 7%. See C. Cassella, et al., "Aluminum Nitride Cross-Sectional Lame Mode Resonators," J. Microelectromechanical Systems, vol. 25, no. 2, pp. 275-285 (2016), which is incorporated herein by reference. With its new bus design, the present invention reduces parasitic capacitance. Prior art devices suffered excess losses from two sources. First, their anchor design resulted in acoustic energy being lost to the surrounding device structure. Second, their tight focus caused significant coupling, for example, due to the side walls, into undesired modes. The present invention reduces both of these sources of excess loss, thereby permitting an even tighter focus. This tighter focus allows a reduction in the number of output fingers and a corresponding reduction in output finger capacitance.

The concepts of the various embodiments of the present invention are not specific to a single material or mode type. The material and mode type can be abstract via effective parameters and the performance of the devices can be expressed in terms of these effective parameters. In general, performance improves with increasing coupling efficiency ($k_t^2$) and degrades with loss. Additionally, the concepts of the various embodiments of the present invention can be extended to bulk acoustic wave (BAW) device modes where material layers are stacked, i.e., a layered, distributed three-dimensional (3D) architecture. In general BAW-based devices have larger $k_t^2$ values than SAW-based devices or devices employing plate modes and can serve as a benchmark to assess potential $k_t^2$ values for SAW and plate mode devices. The $k_t^2$ value is a function of crystal orientation, mode type, and device boundary conditions. The following tables summarize the largest and/or representative $k_t^2$ values as reported in the literature for various materials and mode types.

The following tables reflect measured and theoretical $k_t^2$ values for the following piezoelectric materials: Lithium Niobate ($LiNbO_3$), Lithium Tantalate ($LiTaO_3$), Aluminum Nitride (AlN), Scandium Aluminum Nitride ($Sc_xAl_{1-x}N$), Potassium Niobate ($KNbO_3$), Quartz ($SiO_2$), Gallium Arsenide (GaAs), Aluminum Gallium Arsenide ($Al_xGa_{-x}$As), Gallium Nitride (GaN), Zinc Oxide (ZnO), Cadmium Sulfide (CdS), and Lead Zirconate Titanate (PZT, $Pb[Zr_x Ti_{1-x}]O_3$). Other possible piezoelectric materials include at least: Langatate ($La_3Ga_{5.5}Ta_{0.5}O_{14}$), Lanasite ($La_3Ga_5SiO_{14}$), Lithium Tetraborate ($Li_2B_4O_7$), and various Lead-based Ceramics. The following tables reflect $k_t^2$ values for some of the following mode types: bulk (or slab) acoustic wave modes include acoustic plate wave (APW), asymmetric, film bulk acoustic wave (FBAR), flexure plate, Lamb, lateral field excitation (LFE), longitudinal BAW (L-BAW), shear BAW (S-BAW), shear horizontal, symmetric, thick slab, thickness extension mode (TEM), and thickness shear mode-quartz crystal microbalance BAW modes; while SAW modes include flexural plate wave (FPW), gap, Lamb, Lame, longitudinal leaky, Love, pseudo-surface acoustic waves (P-SAW), Rayleigh SAW (R-SAW), Scholte, shear horizontal SAW (SH-SAW), Sezawa, Stoneley, and surface skimming bulk wave modes.

TABLE 1

LiNbO₃

| Material | Cut | Mode | $k_t^2$ |
|---|---|---|---|
| LiNbO₃ | 128° Y-X | SAW | 5.5% |
| LiNbO₃ | 64° Y-X | LSAW | 11.3% |
| LiNbO₃ | 41° Y-X | LSAW | 17.2% |
| LiNbO₃ | Y-cut, Z-axis | SAW | 4.9% |

TABLE 2

LiTaO₃

| Material | Cut | Mode | $k_t^2$ |
|---|---|---|---|
| LiTaO₃ | 36° Y-X | SSBW | 5.5% |
| LiTaO₃ | 42° Y-X | SSBW | 11.3% |
| LiTaO₃ | 112.2° X-Y | LSAW | 17.2% |

TABLE 3

LiNbO$_3$ plate waves

| Material | Cut | Mode | $k_t^2$ |
|---|---|---|---|
| LiNbO$_3$ | 170° X-Y | SH-SAW | 37.7% |
| LiNbO$_3$ | X | Lamb | 30% |

TABLE 4

AlN and Sc$_x$Al$_{1-x}$N

| Material | Cut | Mode | $k_t^2$ |
|---|---|---|---|
| AlN | Sputtered Z-axis | Lamb | 3.5% |
| AlN | Sputtered Z-axis | Asym. | 1.5% |
| AlN | Sputtered Z-axis | Lamé | 7% |
| Sc$_{0.2}$Al$_{0.8}$N | Sputtered Z-axis | Lamb | 4.5% |
| AlN on Silicon Carbide | Sputtered Z-axis | Lamb | 2.4% |

TABLE 5

KNbO$_3$

| Material | Cut | Mode | $k_t^2$ |
|---|---|---|---|
| Poled KNbO$_3$ | Y-X | SH0 | 98% |

TABLE 6

Other SAW Materials

| Material | Cut | Mode | $k_t^2$ |
|---|---|---|---|
| Quartz | 73° Y | Rayleigh | 0.29% |
| GaAs | [110] | Rayleigh | 0.07% |
| AlGaAs | [100] | Rayleigh | 0.16% |
| GaN | [001] | Rayleigh | 0.1% |

TABLE 7

Other BAW Materials

| Material | Cut | Mode | $k_t^2$ |
|---|---|---|---|
| ZnO | Along crystal axis (trigonal symmetry) | Long. | 7.2% |
| CdS | Along crystal axis (trigonal symmetry) | Long. | 2.4% |
| Ceramic PZT-4 | Along crystal axis (trigonal symmetry) | Long. | 26% |

TABLE 8

Other Composites

| Material | Cut | Mode | $k_t^2$ |
|---|---|---|---|
| ZnO on Pyrex glass | C-axis | Rayleigh | 2.5% |
| ZnO on Diamond | C-axis | Rayleigh | 3.2% |

Features from any of the disclosed embodiments may be used in combination with one another, without limitation. In addition, other features and advantages of the present disclosure will become apparent to those of ordinary skill in the art through consideration of the following detailed description and the accompanying drawings.

BRIEF DESCRIPTION OF THE DRAWINGS

The drawings illustrate several embodiments of the invention, wherein identical reference numerals refer to identical or similar elements or features in different views or embodiments shown in the drawings. The drawings are not to scale and are intended only to illustrate the elements of various embodiments of the present invention.

DETAILED DESCRIPTION

Figure 1:
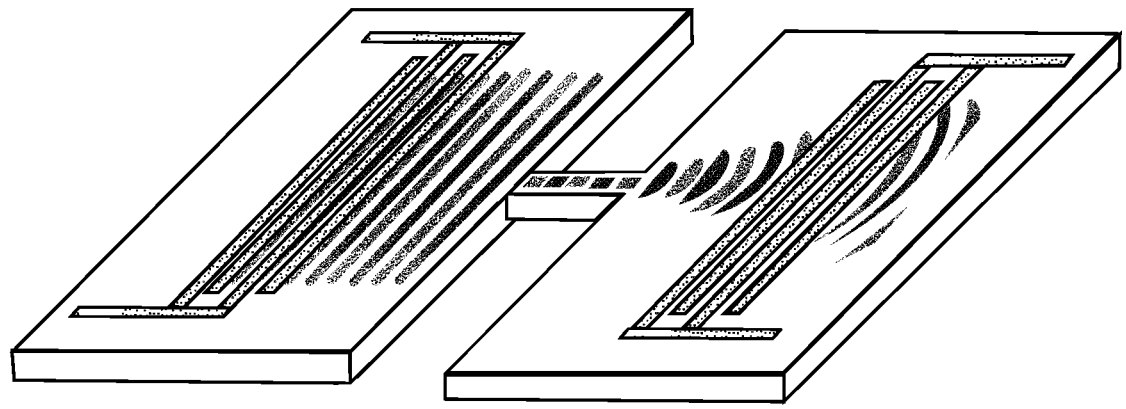
FIG. 1 illustrates the coupling inefficiencies of prior art straight finger IDTs when used with wavelength-scale features.
Figure 2A:
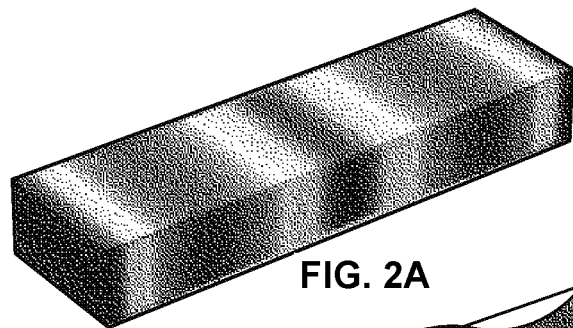
FIGS. 2A-2C illustrate the desired symmetric, the undesired shear horizontal, and the undesired antisymmetric modes, respectively, in accordance with various embodiments of the present invention.
Figure 2B:
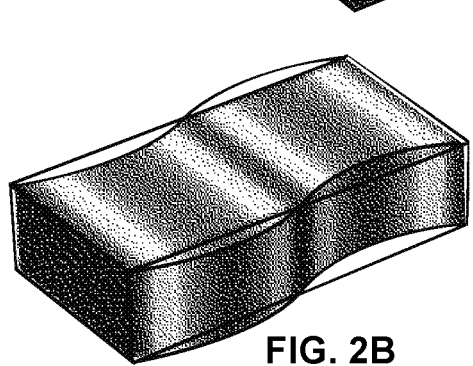
Figure 2C:
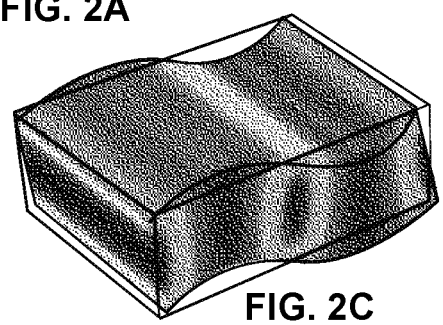
Figure 3:
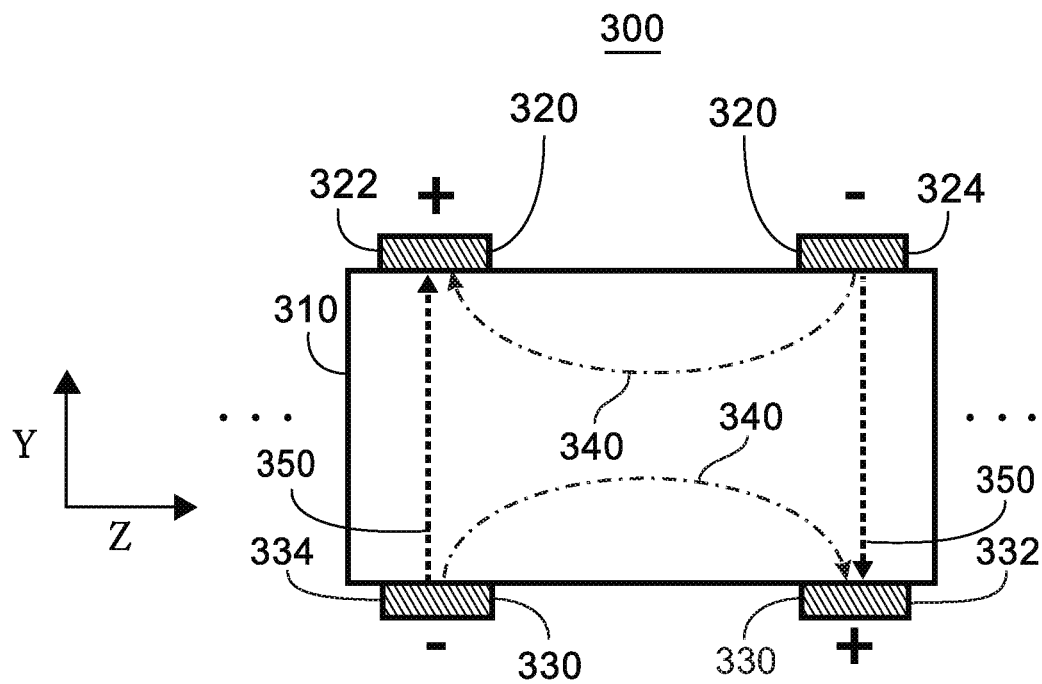
FIG. 3 illustrates a cross-sectional view of a portion of a focusing transducer in accordance with at least one embodiment of the present invention.

FIG. 3 illustrates a cross-sectional view of a portion of a focusing transducer 300 in accordance with at least one embodiment of the present invention. The focusing transducer 300 is formed on a piezoelectric layer 310. A first set of interdigital transducer (IDT) fingers 320 are formed on the top surface of the piezoelectric layer 310 with alternating signal polarities being applied to corresponding alternating fingers 322 (positive), 324 (negative or ground). A second set of IDT fingers 330 are formed on the bottom surface of the piezoelectric layer 310 with alternating signal polarities being applied to corresponding alternating fingers 332 (positive), 334 (negative or ground). The second set of IDT fingers 330 are located directly opposite the first set of IDT fingers 320.

As shown in FIG. 3, the polarity of the signal applied to opposing fingers are opposite. This results in the formation of both lateral electric fields 340 and vertical electric fields 350 within the piezoelectric layer 310. Because the first and second sets of IDT fingers 320, 330 form both lateral and vertical electric fields 340, 350, the focusing transducer 300 couples to both the $e_{31}$ and $e_{33}$ piezoelectric coefficients of the piezoelectric layer 310. This coupling to both the $e_{31}$ and $e_{33}$ piezoelectric coefficients of the piezoelectric layer 310 results in a two-dimensional mechanical mode of vibration, characterized by longitudinal vibrations along both the width and the thickness of the piezoelectric layer 310. It is through this coupling to both the $e_{31}$ and $e_{33}$ piezoelectric coefficients of the piezoelectric layer 310 to excite Lame modes, that the coupling efficiency $k_t^2$ may be as high as 7% for a piezoelectric layer 310 formed of AlN.

Figure 4:
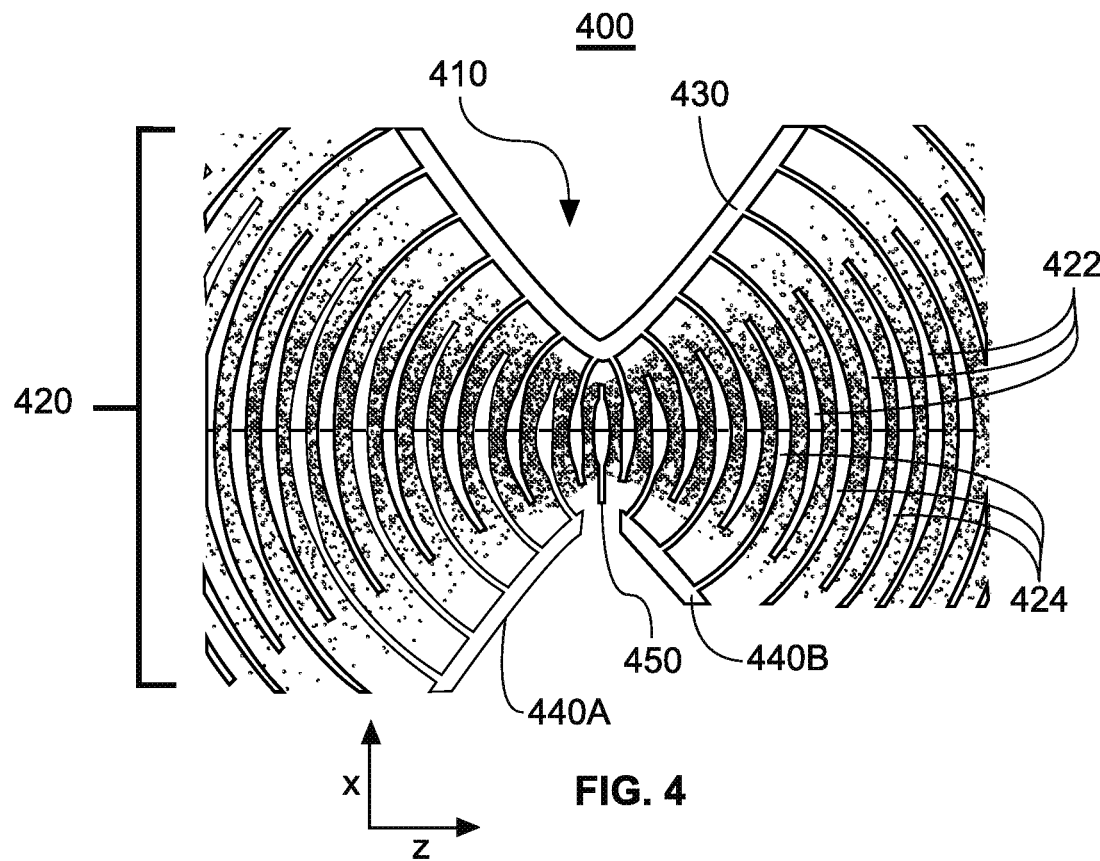
FIG. 4 illustrates a plan view of a portion of a focusing transducer in accordance with at least one embodiment of the present invention.

FIG. 4 illustrates a plan view of a portion of a focusing transducer 400 in accordance with at least one embodiment of the present invention. The focusing transducer 400 is formed on a piezoelectric layer 410. A first set of IDT fingers 420 are formed on the top surface of the piezoelectric layer 410 with alternating signal polarities being applied to corresponding alternating fingers 422, 424. A second set of IDT fingers, not shown, are formed on the bottom surface of the piezoelectric layer 410. The second set of IDT fingers are located directly opposite the first set of IDT fingers 420. A first signal bus 430, for applying the first signal polarity, is formed on the top surface of the piezoelectric layer 410 and is electrically coupled to the alternating fingers 422. A second signal bus 440A, 440B, for applying the second (opposite) signal polarity, is formed on the top surface of the piezoelectric layer 410 and is electrically connected to the other alternating fingers 424. As the first and second signal polarities must also be applied to the second set of IDT fingers, the focusing transducer 400 may, for example, employ vias through the piezoelectric layer 410, not shown, to couple the first and second signal polarities from the first and second signal buses 430, 440A, 440B, to corresponding buses, not shown, on the bottom surface of the piezoelectric layer 410. These vias may be located in the peripheral portion of the focusing transducer 400, or in the suspended portion of the focusing transducer 400. The first and second sets of IDT fingers 420 are used to apply an input signal to the focusing transducer 400.

A third set of IDT fingers 450, comprising one or more individual fingers, is located between each half of the first set of IDT fingers 420 on the top surface of the piezoelectric layer 410. A fourth set of IDT fingers, not shown, having the same number of individual fingers as the third set of IDT fingers 450, is located directly opposite the third set of IDT fingers 450 on the bottom surface of the piezoelectric layer 410. The third and fourth sets of IDT fingers 450 are used to receive an output signal from the focusing transducer 400.

As shown in FIG. 4, each of the fingers in the first set of IDT fingers 420 is a portion of an arc having a radius R and has a width L that varies along its length. The following discussion provides details regarding designing the radius R and the width L, as both are a function of position and are not the same for each IDT finger. The IDT fingers, and the acoustic wave generated therewith, may be likened to the optical fields in a Gaussian confocal optical resonator. As will be appreciated by one of ordinary skill in the art, each IDT finger is located along a constant phase front of the acoustic wave, with corresponding IDT fingers, for example, the first set of IDT fingers 420, being located at the same phase point, for example 0°, on consecutive acoustic periods of the acoustic wave in the phononic resonator at a given instant in time. To this end, several of the terms, including the beam waist $w_0$, confocal parameter $z_0$, and far field divergence angle $\theta_D$, will be similar to those used in the field of optics. Throughout this discussion, the z-axis corresponds to the beam or propagation axis, the x-axis is perpendicular to the z-axis and lies in the plane of piezoelectric layer 410, the y-axis corresponds to the thickness direction of the piezoelectric layer 410, while the origin corresponds to the focus, as shown in FIGS. 3 and 4.

Turning first to the primary parameters of $w_0$, $z_0$, and $\theta_D$, they are related through the following equations:

$$\pi w_0^2 = \lambda z_0 \qquad \text{Eq. 1}$$

$$\theta_D = w_0/z_0 \qquad \text{Eq. 2}$$

in which $\lambda$, corresponds to the acoustic wavelength in the piezoelectric layer 410.

The radius of curvature R, as a function of position z along the propagation axis, is given by:

$$R(z) = z(1 + (z_0/z)^2) \qquad \text{Eq. 3}$$

The set of IDT fingers 420 comprises n individual fingers, with the $1^{st}$ finger closest to the focus, while the $n^{th}$ finger is furthest from the focus. The width of the finger having an index j ($1 \leq j \leq n$) is a function of both j and $\theta$, the angle formed between the z-axis and the point on the $j^{th}$ finger. The area of each individual finger is ideally the same. See A. Siddiqui et al., "Lamb Wave Focusing Transducer for Efficient Coupling to Wavelength-Scale Structures in Thin Piezoelectric Films," J. Microelectromechanical Syst., vol. 27, no. 6, pp. 1054-1070 (2018), which is incorporated herein by reference. To ensure the area of each finger remains approximately constant, the width of the $j^{th}$ finger on the z-axis, $L_j(0)$, falls as $1/j$ relative to the z-axis width of the $1^{st}$ finger, i.e.:

$$L_j(0) \sim (1/j) L_1(0) \qquad \text{Eq. 4}$$

The width of a given finger j as a function of the angle $\theta$, $L_j(\theta)$, is a Gaussian function with its maximum width on the z-axis, i.e., when $\theta$ is 0. Mathematically, the width is:

$$L_j(\theta) = L_j(0) e^{-\theta^2/\theta_D^2} \qquad \text{Eq. 5}$$

Each of the fingers sweeps out to a maximum angle $\theta = \theta_D/2$ so that each finger connects to its corresponding first or second signal bus 430, 440.

The design must also include placement of both phononic reflectors, which are typically the interfaces between the suspended piezoelectric layer 410 and the air defining the cavity in which the piezoelectric layer 410 is suspended. For example, the "left" phononic reflector should be positioned along a constant phase front of the acoustic wave at a distance of $\lambda/4$ (corresponding to a phase difference of 90°) to the left of the nearest finger, i.e., the left-most finger furthest from the focus. Similarly, the "right" phononic reflector should be positioned along a constant phase front of the acoustic wave at a distance of $\lambda/4$ (corresponding to a phase difference of 90°) to the right of the nearest finger, i.e., the right-most finger furthest from the focus. Proper placement of the two phononic reflectors creates the desired phononic resonator.

While the phononic reflectors are typically the interfaces between the suspended piezoelectric layer 410 and the air defining the cavity in which the piezoelectric layer 410 is suspended, the phononic reflectors may be formed of other structures. For example, the phononic reflectors may be formed of phononic crystals. See S. Wang, et al., "GaN MEMS Resonator Using a Folded Phononic Crystal Structure," Solid-State Sensors, Actuators and Microsystems Workshop (Hilton Head Island, S.C.) pp. 72-75 (2014), which is incorporated herein by reference.

Once constant phase fronts have been determined, the IDT fingers for a specific application can be designed to follow the constant phase fronts. For example, in some embodiments of the present invention, the transducer may include a single IDT finger, while other embodiments of the present invention may include a pair of IDT fingers, while still other embodiments may include a more general single phase unidirectional transducer (SPUDT). In each case, the width of the individual IDT finger electrode corresponding to each constant phase front should be narrowed from its z-axis width according to the local intensity of the mode along the constant phase front in accordance with equation 5.

This ideal design methodology must be balanced against several limitations in a classic set of engineering tradeoffs. As will be appreciated by one of ordinary skill in the art, photolithography will place limits on the minimum width of the fingers at large angles of θ if the fingers are to be accurately formed. The minimum width of the fingers at large angles of θ are further limited by electrical impedance, as narrow finger widths at large angles of θ will increase losses between the signal bus 430, 440 and the bulk of the finger. These narrow finger widths at large angles of θ will have reduced mass and stiffness compared to the on z-axis portion of the fingers, affecting device performance. In particular, this reduced mass and stiffness may result in lower electromechanical coupling to the piezoelectric layer 410 or increased impedance mismatch due to local variations in the speed of sound, both of which result in reduced excitation efficiency.

As will also be appreciated by one of ordinary skill in the art, increasing the number of fingers potentially allows one to increase the amount of energy coupled to the piezoelectric layer 410. Photolithography will, however, place an upper limit on the number of fingers as even the on z-axis portion of the fingers must have some minimum width. The number of fingers in the design is effectively increased when a highly reflective back phononic reflector is included in the device. This back phononic reflector will be further discussed with reference to FIGS. 5G and 8H. The number of fingers must also be selected to yield the desired input impedance, thereby placing a limitation on the overall design of the focusing transducer 400.

Figure 5A:
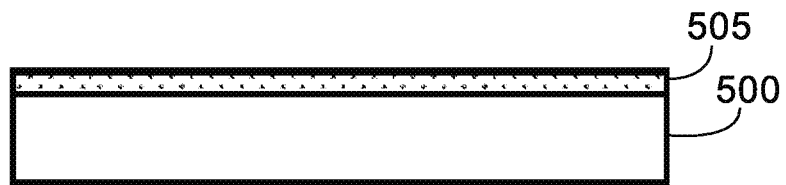
FIGS. 5A-5H illustrate the fabrication sequence for a focusing transducer in accordance with at least one embodiment of the present invention.
Figure 5B:
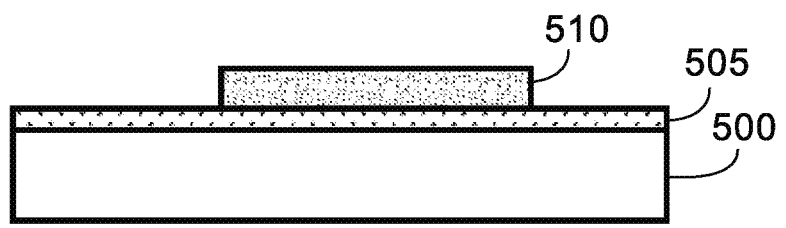

Fabrication of a focusing transducer in accordance with one or more embodiments of the present invention is illustrated in cross-sectional FIGS. 5A-5H. Fabrication of the focusing transducer begins with a substrate 500, for example, a high resistivity silicon wafer, upon which a first silicon dioxide layer 505 is formed, as shown in FIG. 5A. The first silicon dioxide layer 505 preferably has a thickness of approximately 0.3 µm to 1.0 µm, with a more preferred thickness of approximately 0.5 µm to 0.75 µm, and a most preferred thickness of approximately 0.6 µm. A polysilicon layer 510 is formed on the surface of the first silicon dioxide layer 505 and patterned as shown in FIG. 5B. The polysilicon layer 510 forms a release or sacrificial layer as it will be removed in a later fabrication step. The polysilicon layer 510 preferably has a thickness of approximately 2.0 µm to 6.0 µm, with a more preferred thickness of approximately 3.0 µm to 5.0 µm, and a most preferred thickness of 4.0 µm.

Figure 5C:
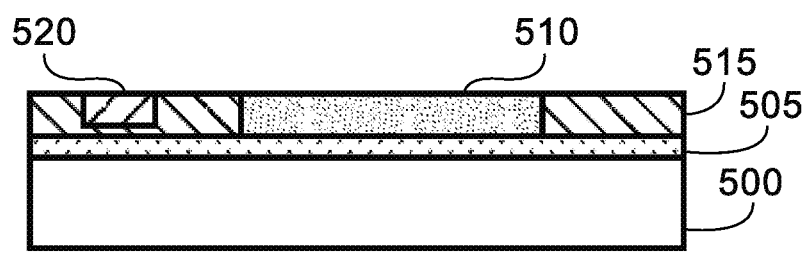

A second silicon dioxide layer 515 is formed on the surface of polysilicon layer 510 and the exposed surface portions of the first silicon dioxide layer 505. The second silicon dioxide layer 515 is then chemically and mechanically polished to square its surface with that of the polysilicon layer 510, resulting in a planar surface. A portion of the second silicon dioxide layer 515 is then etched and a tungsten plug 520 is formed in the etched portion of the second silicon dioxide layer 515, as shown in FIG. 5C. The tungsten plug 520 will ultimately facilitate making contact to a bottom contact layer 525.

Figure 5D:
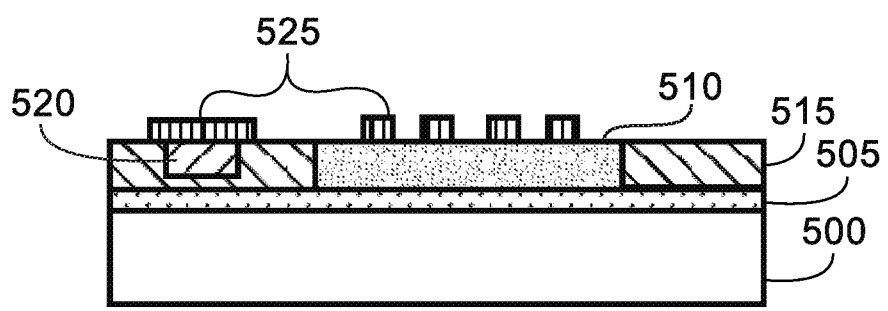

The bottom contact layer 525 is formed on the exposed surfaces of the polysilicon layer 510, the second silicon dioxide layer 515, and the tungsten plug 520. As a portion of the bottom contact layer 525 forms the second set of IDT fingers 330 from FIG. 3, the bottom contact layer 525 is patterned as shown in FIG. 5D. The bottom contact layer 525 preferably satisfies several purposes and requirements. One of these purposes is to facilitate creation of the desired electric fields in the piezoelectric layer 530. To this end, the bottom contact layer 525 should be highly electrically conductive. Depending upon the application, the bottom contact layer 525 may need to be compatible with CMOS fabrication processes, which may limit which metals and materials can be used to form the bottom contact layer 525. In addition, the bottom contact layer 525 serves as the growth template for piezoelectric layer 530, which may place additional constraints on which metals and materials can be used. While the bottom contact layer 525 is shown in FIG. 5D as a single layer, it may preferably be formed of two or more layers. In a preferred embodiment employing a piezoelectric layer 530 formed of AlN, the bottom contact layer 525 comprises layers of titanium (Ti), titanium nitride (TiN), and aluminum (Al), having thicknesses of 20 nm, 20 nm, and 50 nm, respectively. As will be appreciated by one of ordinary skill in the art, other metals, materials, and thicknesses may be employed.

Figure 5E:
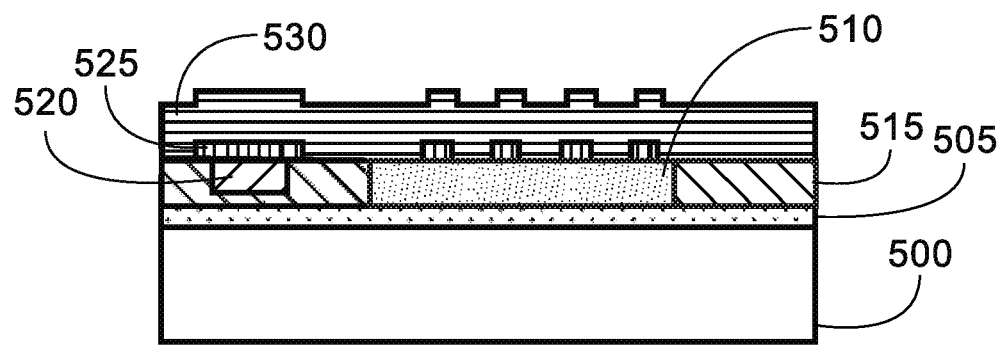

The piezoelectric layer 530 is formed on the exposed surfaces of the polysilicon layer 510, the second silicon dioxide layer 515, and the bottom contact layer 525 as shown in FIG. 5E. The piezoelectric layer 530 may be formed of any suitable piezoelectric material, but is preferably formed of AlN, scandium aluminum nitride (ScAlN), lead zirconate titanate (PZT), or lithium niobite (LiNbO$_3$). The thickness of the piezoelectric layer 530 is preferably from approximately 0.3 to 0.6 of the acoustic wavelength λ, in the piezoelectric layer 530 at the desired operating frequency, with a more preferred thickness being from approximately 0.4 to 0.55 of the acoustic wavelength λ, and a most preferred thickness of approximately 0.45 to 0.5 of the acoustic wavelength λ.

Figure 5F:
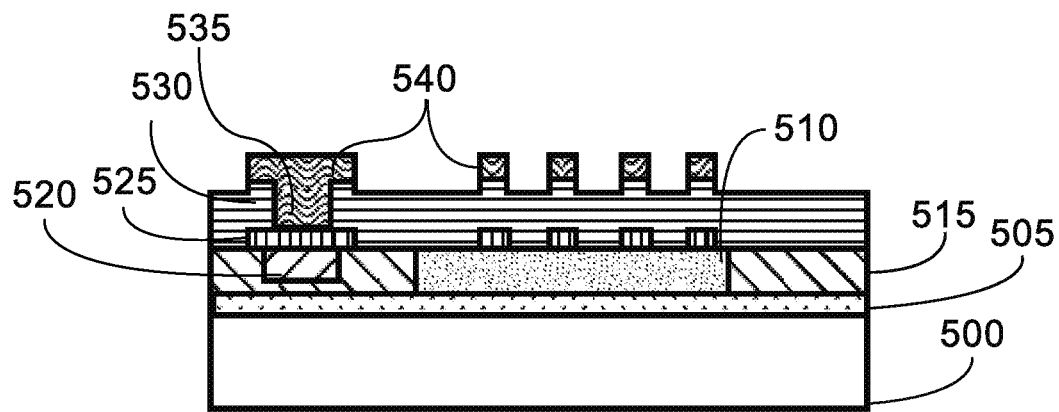

A via 535 is etched through the piezoelectric layer 530 down to the bottom contact layer 525. A top contact layer 540 is then formed on the exposed surface of the piezoelectric layer 530 and in the via 535. As a portion of the top contact layer 540 forms the first set of IDT fingers 320 from FIG. 3, the top contact layer 540 is patterned as shown in FIG. 5F. The top contact layer 540 preferably satisfies many of the same purposes and requirements as the bottom contact layer 525, though it will not serve as the growth template for piezoelectric layer 530. In a preferred embodiment, the top contact layer 540 comprises layers of Al and Ti, having thicknesses of 100 nm and 25 nm, respectively. As will be appreciated by one of ordinary skill in the art, other metals, materials, and thicknesses may be employed.

Figure 5G:
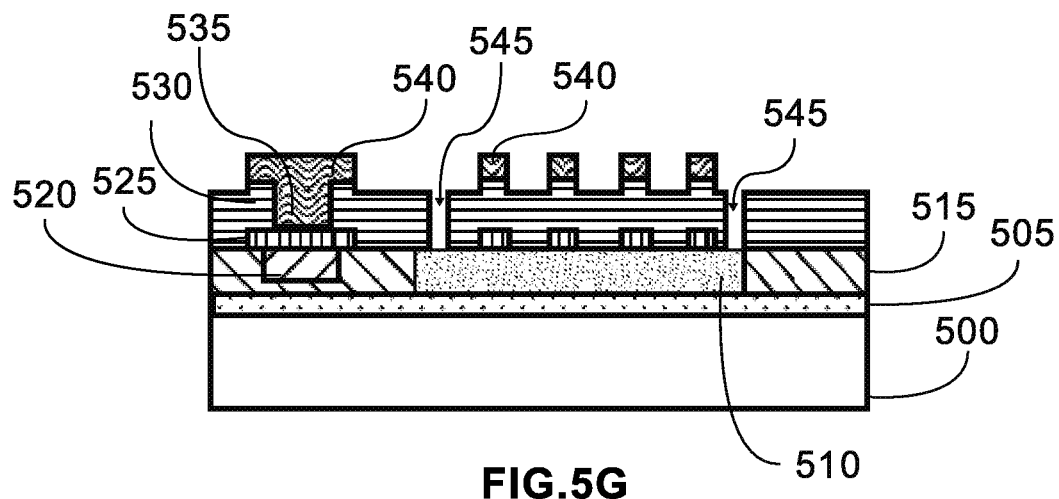
Figure 5H:
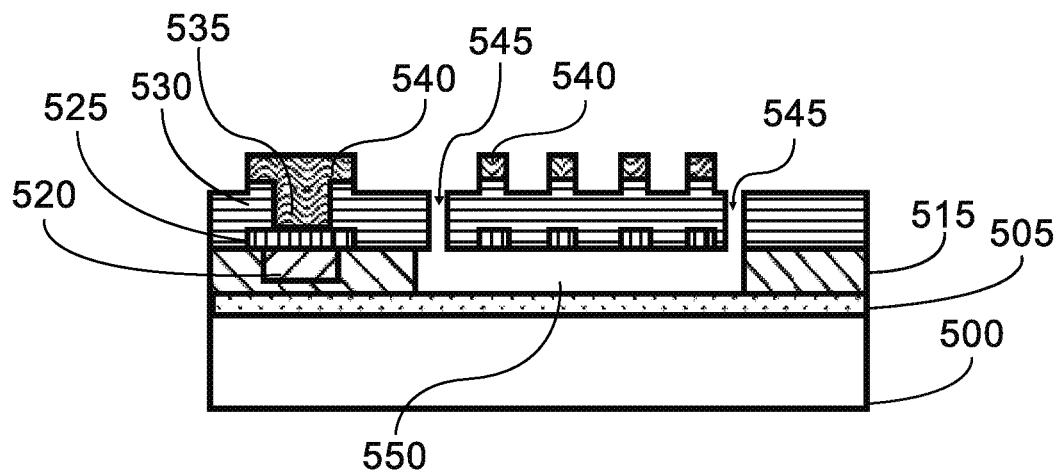

Release trenches 545 are etched through portions of the piezoelectric layer 530 down to the polysilicon layer 510 as shown in FIG. 5G. Some of these release trenches 545 will form the back phononic reflectors discussed above that effectively increase the number of fingers in the first set of IDT fingers 320 from FIG. 3. Portions of the underlying polysilicon layer 510 are then removed using a dry release etch to form a cavity 550 below the active portion of the device as shown in FIG. 5H. The dry release etch may use, for example, $XeF_2$.

As the piezoelectric layer 530 is formed on the bottom contact layer 525, the bottom contact layer 525 serves as a template for growth of the piezoelectric layer 530. It has been determined that when the piezoelectric layer 530 is formed of AlN or ScAlN, selection of the materials used to form bottom contact layer 525 can significantly affect the quality of the AlN or ScAlN used to form the piezoelectric layer 530. In particular, the use of a double-layer metal stack comprised of a layer of titanium (Ti) and a layer of aluminum copper (AlCu) formed on the layer of Ti is preferred for the bottom contact layer 525. Alternatively, the use of a triple-layer metal stack comprised of a layer of Ti, a layer of titanium nitride (TiN) formed on the layer of Ti, and a layer of AlCu formed on the layer of TiN is preferred for the bottom contact layer 525. Information regarding these double- and triple-layer metal stacks as templates for the growth of AlN and ScAlN can be found in provisional patent application No. 62/750,405, assigned to National Technology and Engineering Solutions of Sandia, LLC, the assignee of the present application, which is incorporated herein by reference.

Figure 6A:
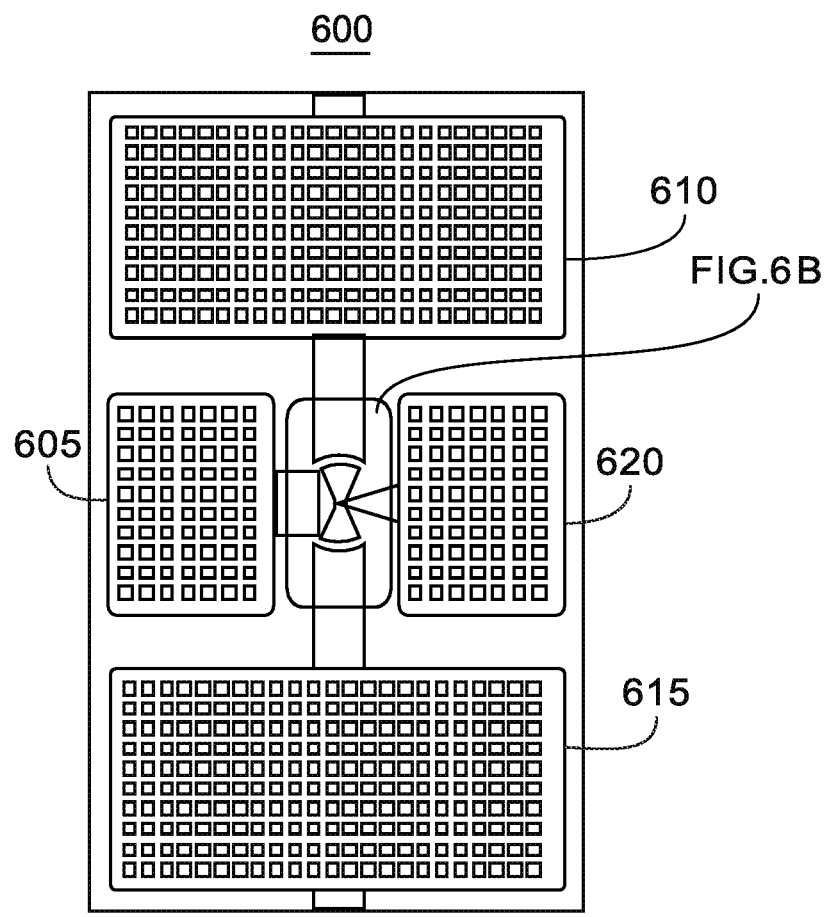
FIGS. 6A-6C illustrate an overall simplified design for a dual-port transformer device in accordance with at least one embodiment of the present invention.

FIG. 6A shows an overall simplified design for a dual-port transformer device 600 in accordance with one or more embodiments of the present invention. The dual-port transformer device 600 includes one positive voltage input pad 605, two negative (or ground) voltage input pads 610, 615, and one positive voltage output pad 620. The dual-port transformer device 600 uses a common negative/ground voltage for the input and output voltages. The positive voltage input pad 605 is electrically connected to a positive voltage input bus 625 shown in FIG. 6B, a close-up of FIG. 6A. The two negative voltage input pads 610, 615 are connected to respective negative voltage input buses 630A, 630B. A positive voltage output bus 635 is electrically connected to the positive voltage output pad 620. A set of positive voltage input fingers 640, corresponding to fingers 322 in FIG. 3, are electrically connected to the positive voltage input bus 625, as shown in FIG. 6C. A set of negative (or ground) voltage input fingers 645, corresponding to fingers 324 in FIG. 3, are electrically connected to the negative voltage input bus 630A. A set of positive voltage output fingers 650 are electrically connected to the positive voltage output bus 635. While not illustrated in FIG. 6B, the dual-port transformer device 600 includes a set of positive voltage input fingers, corresponding to fingers 332 in FIG. 3, and a set of negative (or ground) voltage input fingers, corresponding to fingers 334 in FIG. 3, on the bottom surface of the piezoelectric layer. While not illustrated in FIG. 6B, the dual-port transformer device 600 also includes a positive voltage input bus and a negative (or ground) voltage input bus on the bottom surface of the piezoelectric layer.

The dual-port transformer device 600 includes two end phononic reflector release trenches 655, 660. These end phononic reflector release trenches 655, 660 each form a highly reflective surface for phonons, i.e., an end phononic reflector, that reflects the input acoustic energy back into the dual-port transformer device 600, rather than allowing this acoustic energy to be lost.

The dual-port transformer device 600 shown in FIG. 6A, with its high degree of symmetry about the focus 670, leads to the creation of a highly symmetric acoustic beam. This highly symmetric acoustic beam helps to minimize the amount of acoustic energy that transfers from the desired acoustic mode, for example, the fundamental symmetric mode in a dual-port transformer device 600 employing an AlN piezoelectric layer, into an undesired acoustic mode, for example, a higher order symmetric mode, an asymmetric mode, or a shear horizontal mode.

Figure 6B:
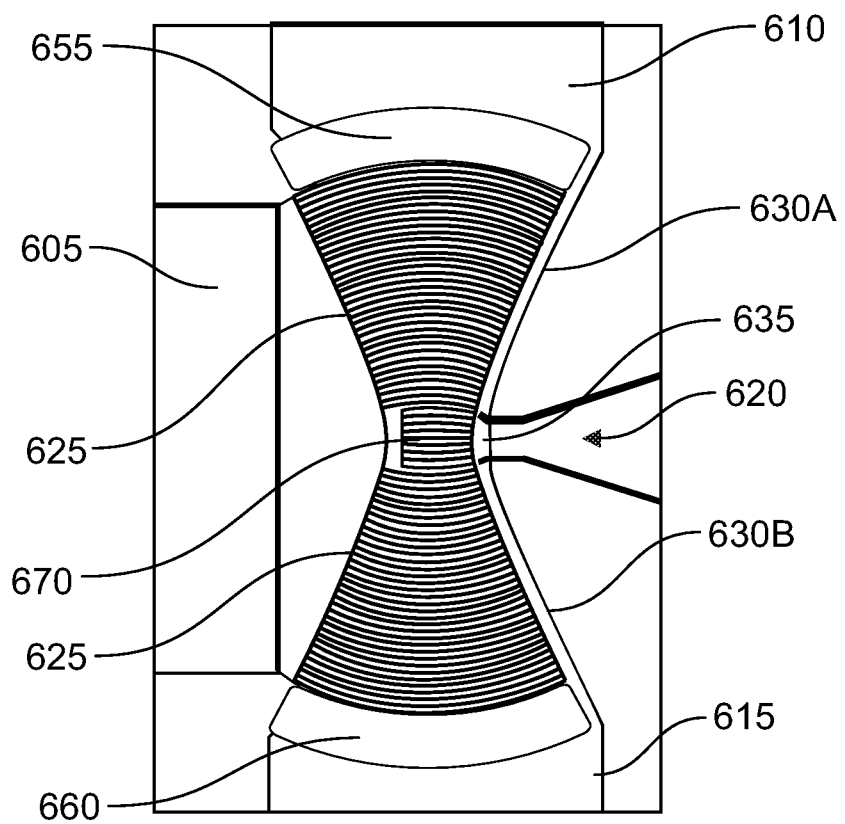
Figure 6C:
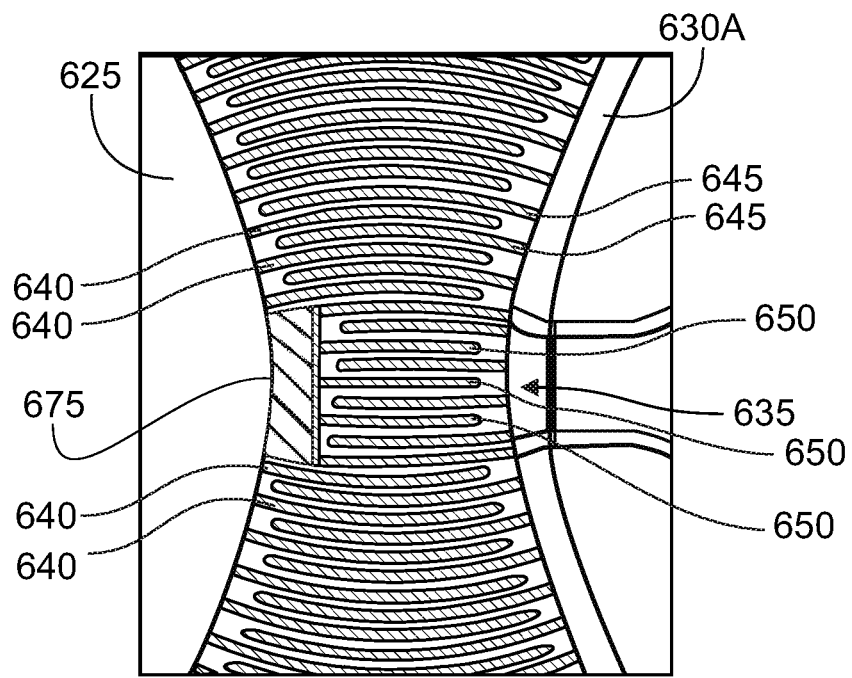

FIG. 6C shows a close-up of FIG. 6B in the region of the focus 670. This close-up shows that the ends of the positive voltage output fingers 650 opposite the positive voltage output bus 635 are connected to each other via a secondary positive voltage output bus 675. Connecting the positive voltage output fingers 650 to the secondary positive voltage output bus 675 helps to improve the coupling efficiency between the piezoelectric layer and the positive voltage output fingers 650.

While the dual-port transformer device 600 shown in FIG. 6A is highly symmetric about the focus due to its "butterfly" or "bow tie" configuration, in other embodiments of the present invention a dual-port transformer device may also be formed with essentially only one wing of the butterfly or half of the bow tie. To ensure impedance matching with this one wing configuration, the area of this one wing will need to be greater than the area of one wing of the dual-port transformer device 600 shown in FIG. 6A. The one wing dual-port transformer device may suffer degraded performance relative to the dual-port transformer device 600 as any anchors near the focus can lead to coupling losses and mixing of the modes within the piezoelectric layer.

In yet other embodiments of the present invention, the overall two wing dual-port transformer device configuration is retained, but input IDT fingers are located on only one wing of the overall two wing dual-port transformer device. This configuration benefits from the high symmetry of the dual-port transformer device 600 shown in FIG. 6A, but does not suffer from the possible coupling losses and mode mixing of a one wing dual-port transformer device.

An experiment was undertaken comparing a straight finger IDT dual-port transformer device to a focusing finger IDT dual-port transformer device similar to the dual-port transformer device 600. Since the charge induced on the voltage output IDT fingers is proportional to the acoustic power beneath the fingers, the degree of voltage gain enhancement is directly proportional to the degree of focusing. However, focusing may result in a reduced output capacitance that can degrade the voltage enhancement, depending on the load. The voltage gain of the focusing finger IDT dual-port transformer device is therefore given by:

$$V_G = V_{G1}(N_{eff}) \times F_{focus} \times \frac{C_{out}}{C_{out} + C_{in}}, \quad \text{Eq. 6}$$

where $V_{G1}(N_{eff})$ is the voltage gain accounting for the input to output finger number $N_{eff}$, $F_{focus}$ is the focusing factor which is the ratio of the aperture of the resonator mode at the input to that of the output, and $C_{out}$ and $C_{in}$ are the output and input capacitances respectively.

Both the straight finger IDT and the focusing finger IDT dual-port transformer devices in this experiment had an input to output finger number ratio of 3.55. The focusing finger IDT dual-port transformer device had a focusing factor $F_{focus}$ of 3.45. For the focusing finger IDT dual-port transformer device, a parasitic capacitance of $C_p$ of 75 fF was measured, which resulted in a 6-fold reduction of the voltage gain where $C_{out}$ was 13 fF. As the reduced voltage gain with this parasitic capacitance was 6.7, the extrapolated gain without this parasitic capacitance was 40. This compares with a measured parasitic capacitance reduced voltage gain of 4.0 for the straight finger IDT dual-port transformer device, and an extrapolated gain without parasitic capacitance of 6.8. Thus, the focusing finger IDT dual-port transformer device should provide a voltage gain advantage of a factor of 5.9, i.e., 40/6.8, relative to the straight finger IDT dual-port transformer device. The voltage gain of the focusing finger IDT dual-port transformer device could be further enhanced by using a tighter focus, thereby increasing the focusing factor $F_{focus}$, and optimizing the output IDT finger design to avoid spur modes and loses associated with the anchors.

In an alternative embodiment of the present invention, the dual-port transformer device 600 includes a single negative voltage input bus as the two negative voltage input buses 630A, 630B are electrically connected by a bridge over (or under) the positive voltage output bus 635. In yet another alternative embodiment of the present invention, the dual-port transformer device 600 includes a single negative voltage input bus 630, while the positive voltage output bus 635 is electrically connected to the positive voltage output pad 620 by a bridge over (or under) the negative voltage input bus 630. One advantage of the second bridge design is that it reduces the amount of acoustic energy lost via the output electrical connection as it does not require a more lossy anchor formed of the piezoelectric layer. By reducing this acoustic energy loss, the quality factor Q of the dual-port transformer device increases.

Anchors between the suspended portion of a device and the peripheral portion of the device contribute to the acoustic losses of the device, thereby lowering the quality factor Q of the device. For this reason, the design and location of the anchors must be carefully considered. As one of ordinary skill in the art will appreciate, wider or thicker anchors can lead to larger acoustic losses. Similarly, shorter anchors can lead to larger acoustic losses. Thus, longer and narrower or thinner anchors are generally desirable, but must be countered by the need for sufficient support for the suspended portion of the device.

Physically identical anchors, in terms of length, width, and thickness, may result in significantly different acoustic losses based upon their locations. For example, locating an anchor adjacent to the focus of a device can lead to significant losses in two ways. First, due to the high energy density at the focus, there is more energy available that can be lost through the adjacent anchor. Second, this anchor can cause energy in the desired vibrational mode, for example the symmetric mode, to be converted into energy in an undesired vibrational mode, for example, an asymmetric mode. In contrast, by locating an anchor further from the focus, both of these losses can be reduced. Preferably, no anchor will be located within three acoustic wavelengths of the focus and more preferably, no anchor will be located within five acoustic wavelengths of the focus.

As an acoustic wave in a device has peaks, valleys, and nulls, locating an anchor at a null will reduce its impact on losses compared to an anchor located at a peak in the acoustic wave. Stated another way, an anchor should be located where it will least affect the boundary conditions of the suspended portion of the device. As the discontinuity between the edge of the suspended portion of the device and the release trench, for example end phononic reflector release trenches 655, 660 in FIG. 6B, are used to form end phononic reflectors, it is preferred that an anchor not be located at the end phononic reflector.

Each anchor is formed by the piezoelectric layer within the device, for example, piezoelectric layer 530 in the device illustrated in FIG. 5. As will be described below, the anchor may optionally include the bottom contact layer 525 and/or the top contact layer 540 in the device illustrated in FIG. 5.

Figure 7:
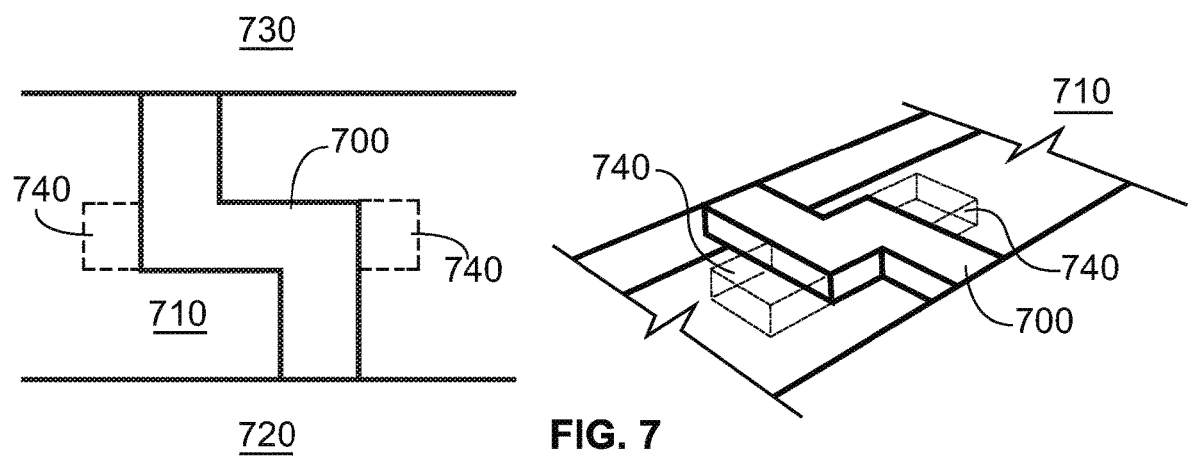
FIG. 7 illustrates a reticulated anchor in accordance with at least one embodiment of the present invention.

As longer anchors may be desirable, the use of a reticulated anchor 700, as shown in FIG. 7, may be preferred. As shown in FIG. 7, the reticulated anchor 700 spans the trench 710 between the suspended portion of the device 720 and the peripheral portion of the device 730. By being reticulated, i.e., by having one or more bends, the reticulated anchor 700 is less likely to support an acoustic wave as the acoustic wave must likewise make one or more bends. A reticulated anchor 700 can, in effect, act like a tuning stub to ensure the acoustic wave and its corresponding energy remains in the suspended portion of the device 720, rather than being coupled, and therefore lost, to the peripheral portion of the device 730. Alternatively, the reticulated anchor 700 may optionally include one or more tuning stubs 740. Thus, through proper tuning of the reticulated anchor 700 and its optional tuning stubs 740, losses may be reduced, thereby increasing the quality factor Q of the device. While FIG. 7 illustrates the use of optional tuning stubs 740 with a reticulated anchor 700, other embodiments of the present invention that employ straight anchors may also employ these optional tuning stubs 740.

As discussed above, the preferred thickness of the piezoelectric layer is on the order of half of an acoustic wavelength $\lambda$, in the piezoelectric layer. As the desired operating frequency increases, this acoustic wavelength necessary decreases. For this reason, high operating frequencies create at least two issues. The first issue created by high operating frequencies is that the quality of the piezoelectric layer typically tends to decrease as its thickness decreases. For example, while a device designed to operate at 1 GHz with a 4.0 µm thick AlN piezoelectric layer may yield satisfactory performance, a device designed to operate at 10 GHz with a 0.4 µm thick AlN piezoelectric layer may or may not yield satisfactory performance. As an extreme example, a device designed to operate at 50 GHz with an 80 nm thick AlN piezoelectric layer will almost certainly not perform satisfactorily as the quality of the 80 nm thick AlN piezoelectric layer will be less than that of a 4.0 µm thick AlN piezoelectric layer.

The second issue with high operating frequencies is the bottom contact layer 525. Specifically, if the piezoelectric layer 530 is formed conformally over the bottom contact layer 525, this will cause unwanted reflections at the discontinuities in the interface between the bottom contact layer 525 and the piezoelectric layer 530. These unwanted reflections will become a greater issue as the piezoelectric layer 530 becomes thinner for higher operating frequencies. This unwanted reflection issue may be reduced by employing a planar fabrication process, as illustrated in FIGS. 8A-8I.

Figure 8A:
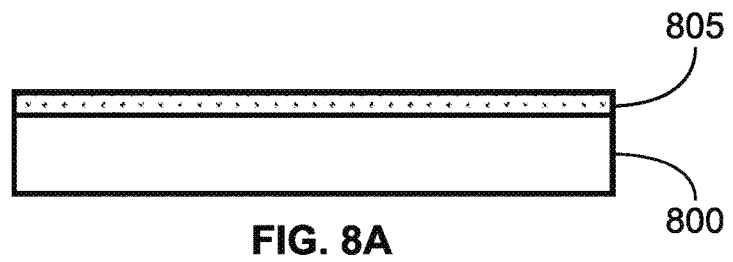
FIGS. 8A-8I illustrate the fabrication sequence for a planar focusing transducer in accordance with at least one embodiment of the present invention.
Figure 8B:
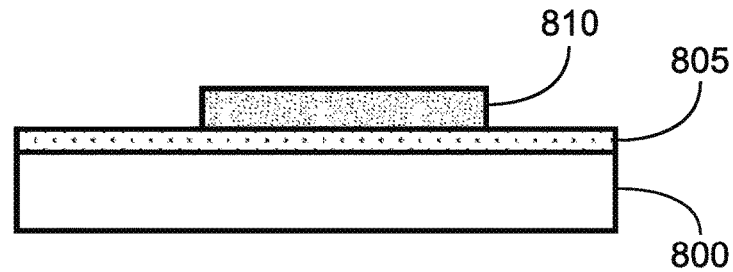

Fabrication of a focusing transducer with a planar piezoelectric layer in accordance with one or more embodiments of the present invention is illustrated in cross-sectional FIGS. 8A-8I. Fabrication of the focusing transducer begins with a substrate 800 upon which a first silicon dioxide layer 805 is formed, as shown in FIG. 8A. A polysilicon layer 810 is formed on the surface of the first silicon dioxide layer 805 and patterned as shown in FIG. 8B. The polysilicon layer 810 forms a release or sacrificial layer as it will be removed in a later fabrication step.

Figure 8C:
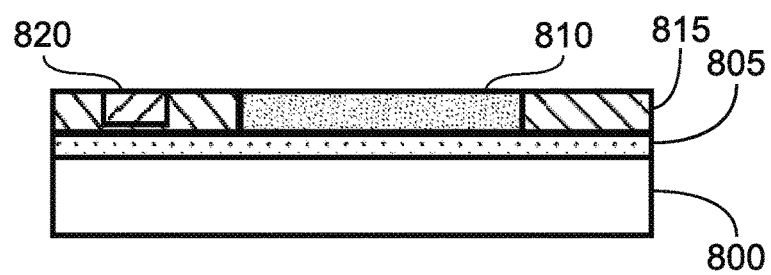

A second silicon dioxide layer 815 is formed on the surface of polysilicon layer 810 and the exposed surface portions of the first silicon dioxide layer 805. The second silicon dioxide layer 815 is then chemically and mechanically polished to square its surface with that of the polysilicon layer 810, resulting in a planar surface. A portion of the second silicon dioxide layer 815 is then etched and a tungsten plug 820 is formed in the etched portion of the second silicon dioxide layer 815, as shown in FIG. 8C. The tungsten plug 820 will ultimately facilitate making contact to a bottom contact layer 825.

Figure 8D:
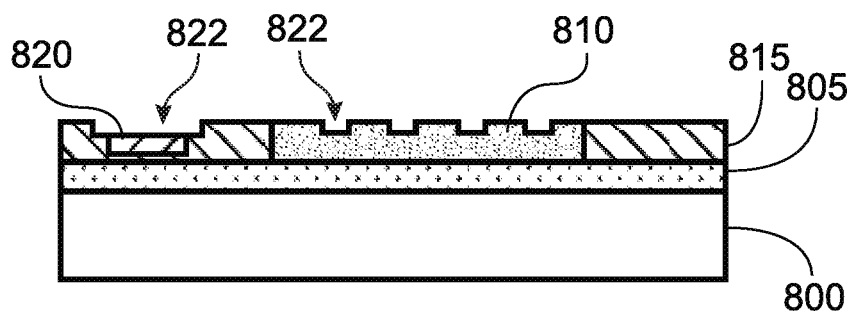
Figure 8E:
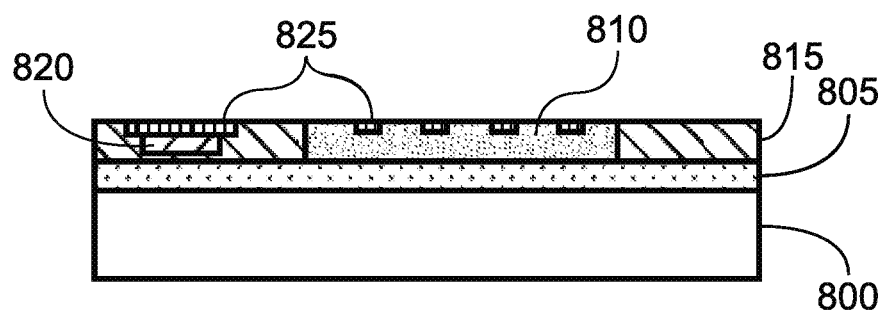

Portions of the polysilicon layer 810, the second silicon dioxide layer 815, and the tungsten plug 820 are then etched to form recesses 822, as shown in FIG. 8D, which will ultimately define the bottom contact layer 825. As the bottom contact layer 825 forms, in part, the second set of IDT fingers 330 from FIG. 3, the recesses 822 will have the pattern of the second set of IDT fingers 330. The bottom contact layer 825 is formed on the exposed surfaces of the polysilicon layer 810, including the recesses 822, the second silicon dioxide layer 815, and the tungsten plug 820. The bottom contact layer 825 is then chemically and mechanically polished to square its surface with that of the polysilicon layer 810, the second silicon dioxide layer 815, and the tungsten plug 820, resulting in a planar surface, as shown in FIG. 8E.

Figure 8F:
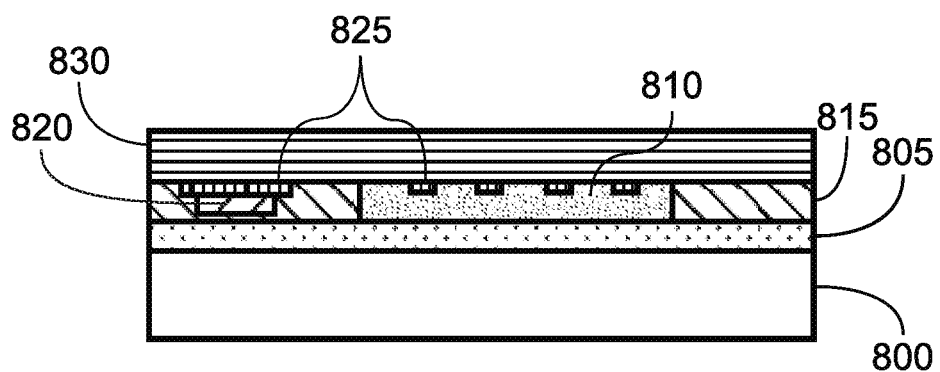

The piezoelectric layer 830 is formed on the exposed surfaces of the polysilicon layer 810, the second silicon dioxide layer 815, the tungsten plug 820, and the bottom contact layer 825, resulting in a planar piezoelectric layer 830 as shown in FIG. 8F.

Figure 8G:
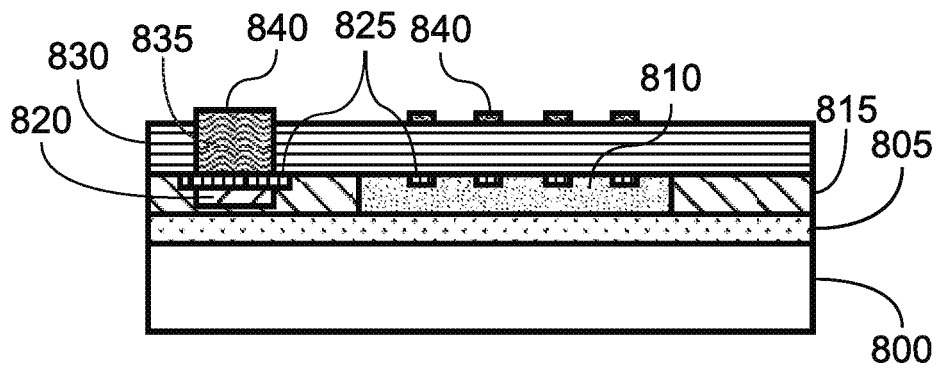

A via 835 is etched through the piezoelectric layer 830 down to the bottom contact layer 825. A top contact layer 840 is then formed on the exposed surface of the piezoelectric layer 830 and in the via 835. As a portion of the top contact layer 840 forms the first set of IDT fingers 320 from FIG. 3, the top contact layer 840 is patterned as shown in FIG. 8G.

Figure 8H:
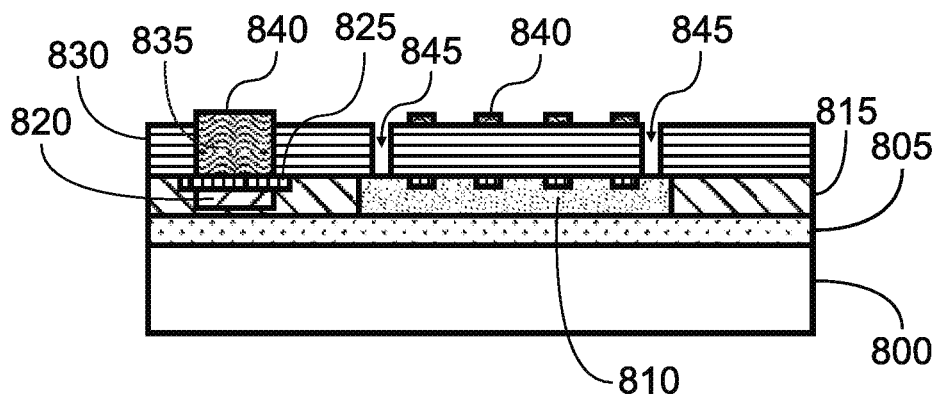
Figure 8I:
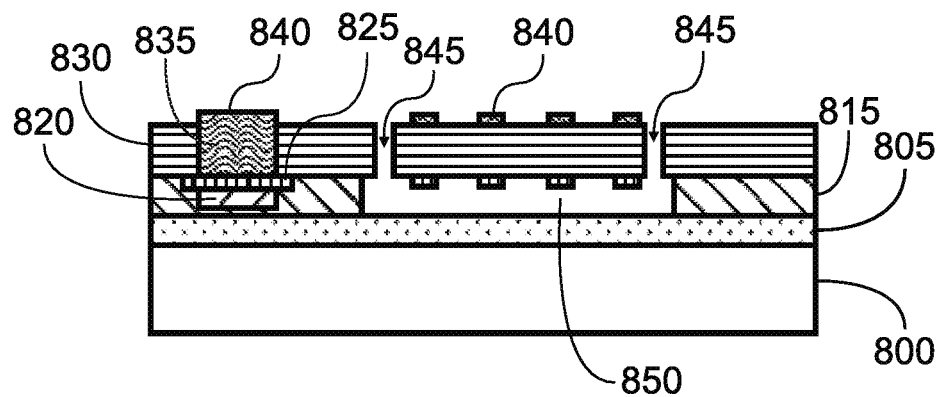

Release trenches 845 are etched through portions of the piezoelectric layer 830 down to the polysilicon layer 810 as shown in FIG. 8H. Some of these release trenches 845 will form the back phononic reflectors discussed above that effectively increase the number of fingers in the first set of IDT fingers 320 from FIG. 3. Portions of the underlying polysilicon layer 810 are then removed using a dry release etch to form cavity 850 below the active portion of the device as shown in FIG. 8I.

The thicknesses, materials, and processes employed in the device illustrated in FIGS. 8A-8I, will generally correspond to their counterparts in FIGS. 5A-5G, subject to requirements for high frequency operation.

Figure 9A:
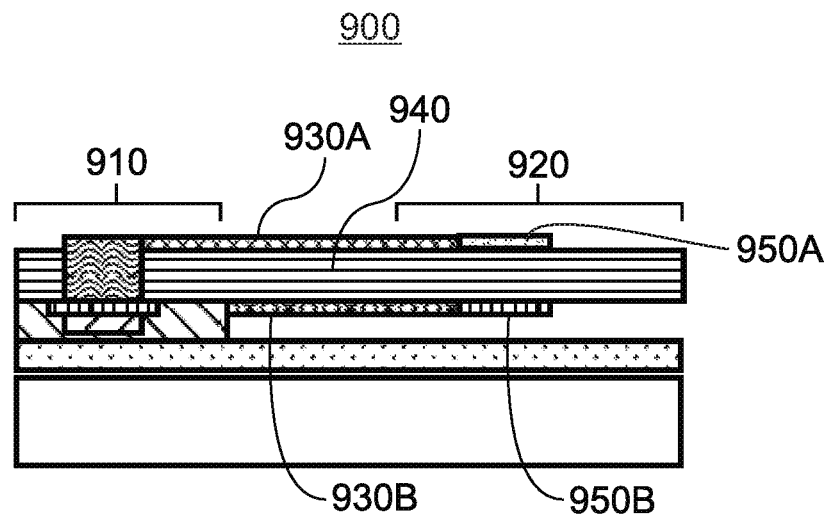
FIGS. 9A-9C illustrate various lead schemes in accordance with various embodiments of the present invention.
Figure 9B:
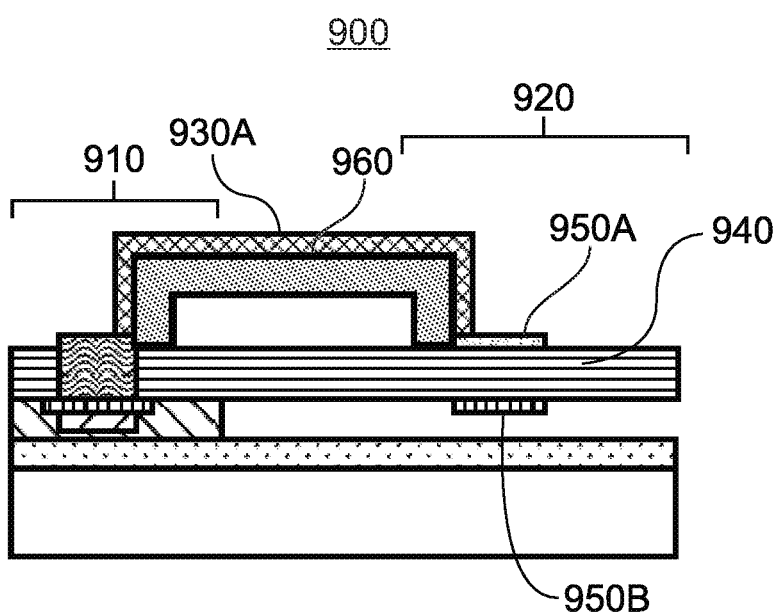

Various embodiments of the present invention employ different lead schemes for getting signals to and from the suspended portions of the devices. As a first example, a lead 930A from the perimeter 910 of a device 900 to the suspended portion 920 of the device 900 may be formed on the top surface of an anchor 940 to connect to a top signal bus 950A, as shown in FIG. 9A. Similarly, a lead 930B from the perimeter 910 of the device 900 may be formed on the bottom surface of the anchor 940 to connect to a bottom signal bus 950B. Forming leads 930A, 930B on the anchor 940 may impact the anchor 940, both mechanically, by altering its flexibility and/or its acoustic loss, and thermally, as the leads 930A, 930B may not expand and contract at the same rate as the anchor 940, leading to stress. To reduce these issues, a lead bridge 960 from the perimeter 910 of a device 900 may, for example, be formed as a bridge over, and parallel to, the top surface of the anchor 940 to connect to the top signal bus 950A, as shown in FIG. 9B. A second lead bridge for connecting to the bottom signal bus 950B may be formed and employ a via through the dielectric layer, not shown. Alternatively, a lead from the perimeter 910 of the device 900 may be formed on the bottom surface of the lead bridge 960 to connect to a bottom signal bus 950B. While the lead bridge 960 is a bridge over, and parallel to, the anchor 940 in FIG. 9B, it may be located at any useful location and may or may not be adjacent to or parallel to the anchor 940.

To reduce resistive losses in the leads 930A, 930B, some embodiments of the present invention use a thick metal bridge. This thick bridge is preferably implemented with the lead bridge 960 design illustrated in FIG. 9B as the acoustic losses will be less than in the lead bridge design illustrated in FIG. 9A. The thick metal bridge preferably has an Al thickness of between 1 μm and 2 μm. Some embodiments of the present invention may also use thick metal to reduce resistive losses in the signal buses, such as the first and second signal buses 430, 440A, 440B illustrated in FIG. 4, or the pads, such as the voltage input and output pads 605, 610, 615, and 620 illustrated in FIG. 6A.

Figure 9C:
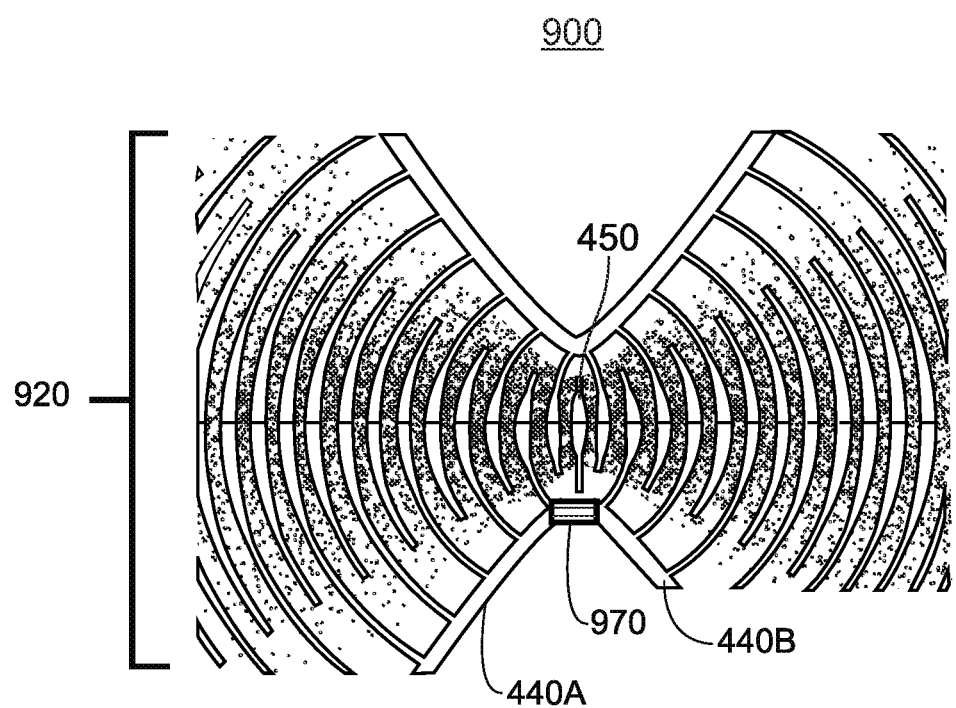

Various embodiments of the present invention also employ different lead schemes for routing signals on the suspended portions of the devices. As a first example, the second signal bus 440A must be connected to the second signal bus 440B shown in FIG. 4. This may be done, for example, on the perimeter of the device, not shown, or as a bridge 970 on the suspended portion 920 of the device 900, as shown in FIG. 9C. By using the bridge 970, access to the third set of IDT fingers 450 is possible on the surface of the suspended portion 920 of the device 900. In an alternative embodiment, not shown, the second signal bus 440A is connected to the second signal bus 440B via an intervening bus on the surface of the suspended portion 920 of the device 900, while the lead to the third set of IDT fingers 450 forms a bridge over the intervening bus.

An additional concern with many device designs is the need to reduce parasitic capacitance, which ultimately reduces the voltage drop across the IDT fingers. These parasitic capacitance losses may occur due to long metal traces. One way to reduce these parasitic capacitance losses is to place a low-K dielectric (including air, potentially) layer between the piezoelectric layer 530 and the top contact layer 540. In some embodiments of the present invention, this dielectric layer may be $SiO_2$. In those embodiments of the present invention with air as the dielectric layer, a sacrificial amorphous silicon or tungsten layer may be used to support the top contact layer 540. The sacrificial layer is subsequently removed by an isotropic gaseous chemical etch, leaving the top contact layer 540 suspended.

Figure 10:
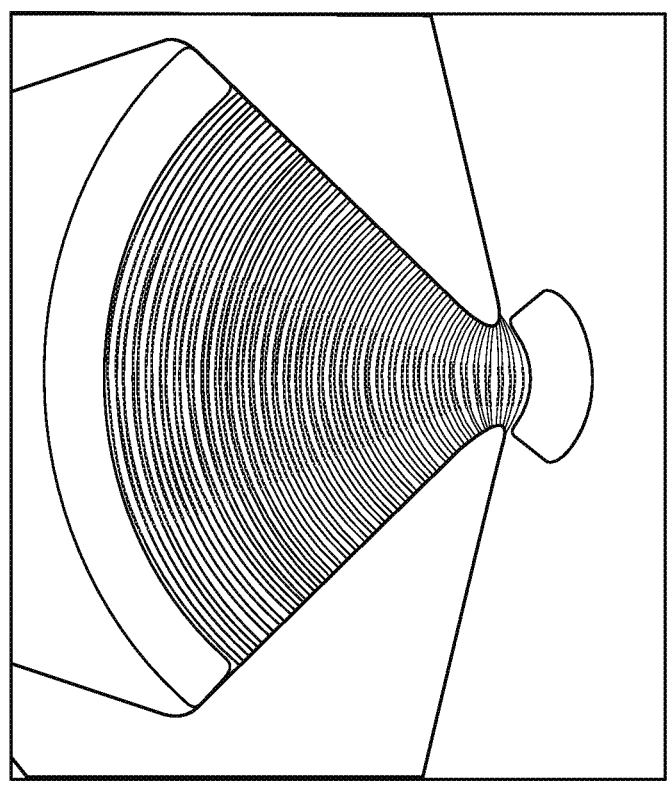
FIG. 10 illustrates a single-port device in accordance with at least one embodiment of the present invention.

While the above descriptions generally relate to dual-port devices, for example, a transformer as shown in FIG. 4 or FIG. 6, alternative embodiments of the present invention relate to single-port devices, for example, filters. These single-port devices, unlike the "butterfly" or "bow tie" configured dual-port devices illustrated in FIG. 4, may employ essentially only one wing of the butterfly or half of the bow tie, as shown in FIG. 10.

Figure 11:
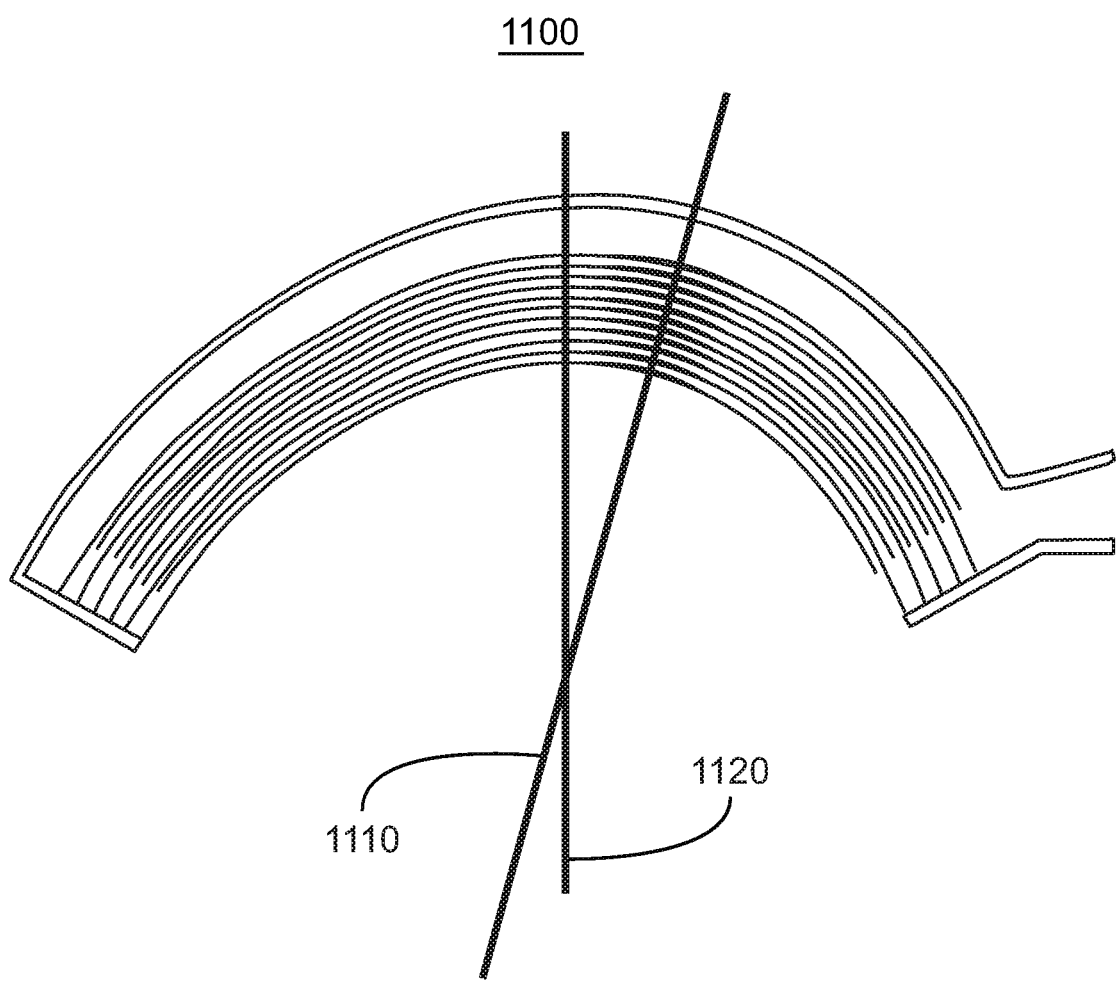
FIG. 11 illustrates an asymmetric focusing transducer in accordance with at least one embodiment of the present invention.

For embodiments employing PZT or LiNbO$_3$ material as the piezoelectric layer, the focusing transducer design will typically not be symmetric about the propagation axis due to the anisotropic nature of the PZT or LiNbO$_3$ material. An example of an asymmetric focusing transducer 1100 is shown in FIG. 11. As shown, the central axis 1110 of the asymmetric focusing transducer 1100 is not parallel to the propagation axis 1120. Another aspect of using LiNbO$_3$ material in some embodiments of the present invention is the preferred use of the sheer horizontal wave mode, not the symmetric wave mode as preferred for AlN and ScAlN materials.

As with embodiments of the invention employing isotropic piezoelectric material, the location of the IDT fingers for embodiments of the present invention employing anisotropic piezoelectric material is important. The location of the IDT fingers for anisotropic piezoelectric material is determined using a k-space analysis. First, one identifies the in-plane dispersion of the anisotropic piezoelectric material, essentially the in-plane k-vector as a function of propagation direction. One then takes a Gaussian distribution of these k-vectors and computes a weighted summation of the k-vectors, i.e., a summation of plane waves corresponding to the k-vectors weighted by the Gaussian amplitude from the distribution. The results are then plotted in real space, thereby yielding well defined constant phase regions, which can then be used to define the locations of the IDT fingers for the anisotropic piezoelectric material. As with the end phononic reflectors for devices employing isotropic piezoelectric material, the two end phononic reflectors for devices employing anisotropic piezoelectric material each fall along a constant phase front of the acoustic wave at a distance of $\lambda/4$ (corresponding to a phase difference of 90°) from the nearest IDT finger, i.e., the left-most or right-most IDT fingers furthest from the focus.

While the above described embodiments of the present invention are designed to operate at a single frequency (or corresponding wavelength), other embodiments of the present invention may operate at two or more frequencies, or even a band of frequencies. Specifically, a phononic resonator with a given set of curved end phononic reflectors can accommodate multiple frequencies/wavelengths, with each frequency/wavelength resonance subject to a corresponding waist, focus, and radius of curvature as specified by above equations 1-3. For every frequency/wavelength, a full set of IDT fingers can be produced following the procedures described above to establish a resonator/filter that accommodates a single frequency/wavelength, with the width of the individual IDT fingers specified by above equations 4-5.

However, a phononic resonator can be designed to accommodate multiple frequencies/wavelengths. This is achieved by locally varying the frequency/wavelength dependent IDT finger parameters along the z-axis, i.e., the line from one phononic reflector to the other phononic reflector perpendicular to phase fronts, to match a targeted transmission/reflection profile. Thus, rather than coupling across the entire length of the phononic resonator, a given frequency/wavelength will be coupled in those regions where the local IDT finger parameters, for example, spacing, width, etc., are best matched. As an example embodiment of the present invention for two frequencies/wavelengths, the device may employ two sets of IDT fingers, with each set of IDT fingers having parameters including periodicity, width, and alignment with constant phase fronts corresponding to one of the two desired frequencies/wavelengths. Thus, in this embodiment operating at two frequencies/wavelengths, the IDT finger parameters are "biperiodic." For a band of frequencies/wavelengths, a corresponding embodiment of the present invention would use a set of IDT fingers in which the frequency/wavelength dependent IDT finger parameters of periodicity, width, and alignment with constant phase fronts are "chirped" to cover the desired band of frequencies/wavelengths.

The invention may be embodied in other specific forms without departing from its spirit or essential characteristics. The described embodiments are to be considered in all respects only as illustrative and not restrictive. The scope of the invention is, therefore, indicated by the appended claims rather than by the foregoing description. All changes which come within the meaning and range of equivalency of the claims are to be embraced within their scope.

The invention claimed is:

1. A focusing interdigital transducer comprising:
   a piezoelectric layer including piezoelectric material;
   a first plurality of IDT fingers formed on a top surface of the piezoelectric layer, each finger of the first plurality of IDT fingers being arc-shaped, a spacing between adjacent fingers of the first plurality of IDT fingers substantially equal to a predetermined length;
   a first bus formed on the top surface of the piezoelectric layer and electrically connected to the first plurality of IDT fingers, the first bus adapted to receive a first polarity of an input signal, the first bus adapted to electrically distribute the first polarity of the input signal to the first plurality of IDT fingers;
   a second plurality of IDT fingers formed on the top surface of the piezoelectric layer, each finger of the second plurality of IDT fingers being arc-shaped, a spacing between adjacent fingers of the second plurality of IDT fingers substantially equal to the predetermined length, a spacing between each finger of the second plurality of IDT fingers and a corresponding adjacent finger of the first plurality of IDT fingers substantially equal to half of the predetermined length;
   a second bus formed on the top surface of the piezoelectric layer and electrically connected to the second plurality of IDT fingers, the second bus adapted to receive a second polarity of the input signal, the second bus adapted to electrically distribute the second polarity of the input signal to the second plurality of IDT fingers;
   a third plurality of IDT fingers formed on a bottom surface of the piezoelectric layer, each finger of the third plurality of IDT fingers being arc-shaped, a spacing between adjacent fingers of the third plurality of IDT fingers substantially equal to the predetermined length, each finger of the third plurality of IDT fingers opposite a corresponding finger of the first plurality of IDT fingers;
   a third bus formed on the bottom surface of the piezoelectric layer and electrically connected to the third plurality of IDT fingers, the third bus electrically connected to the second bus, the third bus adapted to receive the second polarity of the input signal, the third bus adapted to electrically distribute the second polarity of the input signal to the third plurality of IDT fingers;
   a fourth plurality of IDT fingers formed on the bottom surface of the piezoelectric layer, each finger of the fourth plurality of IDT fingers being arc-shaped, a spacing between adjacent fingers of the fourth plurality of IDT fingers substantially equal to the predetermined length, a spacing between each finger of the fourth plurality of IDT fingers and a corresponding adjacent finger of the third plurality of IDT fingers substantially equal to half of the predetermined length, each finger of the fourth plurality of IDT fingers opposite a corresponding finger of the second plurality of IDT fingers;

a fourth bus formed on the bottom surface of the piezoelectric layer and electrically connected to the fourth plurality of IDT fingers, the fourth bus electrically connected to the first bus, the fourth bus adapted to receive the first polarity of the input signal, the fourth bus adapted to electrically distribute the first polarity of the input signal to the fourth plurality of IDT fingers; and wherein when an operating frequency is a single frequency, the predetermined length is equal to an acoustic wavelength in the piezoelectric layer at the single frequency, wherein when the operating frequency is a first frequency and a second frequency, the predetermined length is biperiodic with a first period equal to an acoustic wavelength in the piezoelectric layer at the first frequency and a second period equal to an acoustic wavelength in the piezoelectric layer at the second frequency, wherein when the operating frequency is a band of frequencies between a lower frequency and an upper frequency, the predetermined length is chirped between a lower period equal to an acoustic wavelength in the piezoelectric layer at the lower frequency and an upper period equal to an acoustic wavelength in the piezoelectric layer at the upper frequency, wherein a $j^{th}$ finger of the first, second, third, and fourth pluralities of IDT fingers has a width $L_j(\theta)$ substantially equal to $L_j(0)e^{-\theta^2/\theta_D^2}$, with $L_j(0)$ corresponding to a width of the $j^{th}$ finger on a propagation axis of the focusing interdigital transducer, $\theta$ corresponding to an angle from the propagation axis, and $\theta_D$ corresponding to a far field divergence angle of the focusing interdigital transducer, and wherein the first, second, third, and fourth pluralities of IDT fingers are adapted to create Lamé waves in the piezoelectric layer.

2. The focusing interdigital transducer of claim 1, wherein the piezoelectric material comprises at least one of AlN, ScAlN, PZT, and $LiNbO_3$.

3. The focusing interdigital transducer of claim 1, wherein a thickness of the piezoelectric layer is between approximately 0.4 and approximately 0.55 of the predetermined length.

4. The focusing interdigital transducer of claim 1, wherein the $j^{th}$ finger of the first, second, third, and fourth pluralities of IDT fingers has a width $L_j(0)$ on the propagation axis approximately equal to $(1/j)L_1(0)$, with $L_1(0)$ corresponding to a width of a finger of a corresponding first, second, third, and fourth plurality of IDT fingers on the propagation axis closest to a focus of the focusing interdigital transducer.

5. The focusing interdigital transducer of claim 1,
wherein each of the top and bottom surfaces of the piezoelectric layer is planar, and
wherein the top and bottom surfaces of the piezoelectric layer are substantially parallel.

6. The focusing interdigital transducer of claim 1, wherein each finger of the first, second, third, and fourth pluralities of IDT fingers has a radius of curvature $R(z)$ substantially equal to $z(1+(z_0/z)^2)$, with z corresponding to a distance to a focus of the focusing interdigital transducer and $z_0$ corresponding to a confocal parameter of the focusing interdigital transducer.

7. The focusing interdigital transducer of claim 1, further comprising a plurality of anchors, each of the plurality of anchors physically connected to the piezoelectric layer, each of the plurality of anchors comprising the piezoelectric material.

8. The focusing interdigital transducer of claim 7, wherein at least one of the plurality of anchors is a reticulated anchor.

9. The focusing interdigital transducer of claim 7, wherein at least one of the plurality of anchors includes at least one tuning stub.

10. The focusing interdigital transducer of claim 1, further comprising a low-K dielectric layer formed between at least one of the first, second, third, and fourth buses and the piezoelectric layer.

11. The focusing interdigital transducer of claim 1, further comprising at least one thick metal bridge electrically connected to at least one of the first, second, third, and fourth buses, the at least one thick metal bridge having a metal thickness of between approximately 1.0 µm and approximately 2.0 µm.

12. The focusing interdigital transducer of claim 1, further comprising a release trench, a back phononic reflector being formed at the interface between the release trench and an adjacent edge of the piezoelectric layer.

13. The focusing interdigital transducer of claim 1, further comprising a cavity, the cavity being adjacent the bottom surface of the piezoelectric layer, the third and fourth pluralities of IDT fingers, and the third and fourth buses.

14. The focusing interdigital transducer of claim 1, wherein each of the fingers of the first, second, third, and fourth pluralities of IDT fingers are symmetric with respect to the propagation axis if the piezoelectric material is isotropic, and wherein each of the fingers of the first, second, third, and fourth pluralities of IDT fingers are asymmetric with respect to the propagation axis if the piezoelectric material is anisotropic.

15. A dual-port transformer comprising:
a phononic resonator, the phononic resonator including:
    a piezoelectric layer including piezoelectric material;
    a first phononic reflector at a first end of the piezoelectric layer; and
    a second phononic reflector at a second end of the piezoelectric layer opposite the first end;
an input focusing interdigital transducer, the input focusing interdigital transducer including:
    a first plurality of input IDT fingers formed on a top surface of the piezoelectric layer, each finger of the first plurality of input IDT fingers being arc-shaped, a spacing between adjacent fingers of the first plurality of input IDT fingers substantially equal to a predetermined length;
    a first bus formed on the top surface of the piezoelectric layer and electrically connected to the first plurality of input IDT fingers, the first bus adapted to receive a first polarity of an input signal, the first bus adapted to electrically distribute the first polarity of the input signal to the first plurality of input IDT fingers;
    a second plurality of input IDT fingers formed on the top surface of the piezoelectric layer, each finger of the second plurality of input IDT fingers being arc-shaped, a spacing between adjacent fingers of the second plurality of input IDT fingers substantially equal to the predetermined length, a spacing between each finger of the second plurality of input IDT fingers and a corresponding adjacent finger of the first plurality of input IDT fingers substantially equal to half of the predetermined length;

a second bus formed on the top surface of the piezoelectric layer and electrically connected to the second plurality of input IDT fingers, the second bus adapted to receive a second polarity of the input signal, the second bus adapted to electrically distribute the second polarity of the input signal to the second plurality of input IDT fingers;

a third plurality of input IDT fingers formed on a bottom surface of the piezoelectric layer, each finger of the third plurality of input IDT fingers being arc-shaped, a spacing between adjacent fingers of the third plurality of input IDT fingers substantially equal to the predetermined length, each finger of the third plurality of input IDT fingers opposite a corresponding finger of the first plurality of input IDT fingers;

a third bus formed on the bottom surface of the piezoelectric layer and electrically connected to the third plurality of input IDT fingers, the third bus electrically connected to the second bus, the third bus adapted to receive the second polarity of the input signal, the third bus adapted to electrically distribute the second polarity of the input signal to the third plurality of input IDT fingers;

a fourth plurality of input IDT fingers formed on the bottom surface of the piezoelectric layer, each finger of the fourth plurality of input IDT fingers being arc-shaped, a spacing between adjacent fingers of the fourth plurality of input IDT fingers substantially equal to the predetermined length, a spacing between each finger of the fourth plurality of input IDT fingers and a corresponding adjacent finger of the third plurality of input IDT fingers substantially equal to half of the predetermined length, each finger of the fourth plurality of input IDT fingers opposite a corresponding finger of the second plurality of input IDT fingers;

a fourth bus formed on the bottom surface of the piezoelectric layer and electrically connected to the fourth plurality of input IDT fingers, the fourth bus electrically connected to the first bus, the fourth bus adapted to receive the first polarity of the input signal, the fourth bus adapted to electrically distribute the first polarity of the input signal to the fourth plurality of input IDT fingers;

wherein the first, second, third, and fourth pluralities of input IDT fingers define a focus on a propagation axis of the dual-port transformer, wherein when an operating frequency is a single frequency, the predetermined length is equal to an acoustic wavelength in the piezoelectric layer at the single frequency, wherein when the operating frequency is a first frequency and a second frequency, the predetermined length is biperiodic with a first period equal to an acoustic wavelength in the piezoelectric layer at the first frequency and a second period equal to an acoustic wavelength in the piezoelectric layer at the second frequency, wherein when the operating frequency is a band of frequencies between a lower frequency and an upper frequency, the predetermined length is chirped between a lower period equal to an acoustic wavelength in the piezoelectric layer at the lower frequency and an upper period equal to an acoustic wavelength in the piezoelectric layer at the upper frequency, wherein a $j^{th}$ finger of the first, second, third, and fourth pluralities of input IDT fingers has a width $L_j(0)$ substantially equal to $L_j(0)e^{-\theta^2/\theta_D^2}$, with $L_j(0)$ corresponding to a width of the $j^{th}$ finger on the propagation axis of the dual-port transformer, $\theta$ corresponding to an angle from the propagation axis, and $\theta_D$ corresponding to a far field divergence angle of the dual-port transformer, and wherein the first, second, third, and fourth pluralities of input IDT fingers are adapted to create Lamé waves in the piezoelectric layer; and an output interdigital transducer, the output interdigital transducer including:
one or more first output IDT fingers formed on the top surface of the piezoelectric layer, one of the one or more first output IDT fingers formed at the focus of the dual-port transformer, the one or more first output IDT fingers adapted to transmit a first polarity of a transformed output signal; and
one or more second output IDT fingers formed on the bottom surface of the piezoelectric layer, one of the one or more second output IDT fingers formed at the focus of the dual-port transformer, the one or more second output IDT fingers adapted to transmit a second polarity of the transformed output signal.

16. The dual-port transformer of claim 15, wherein the $j^{th}$ finger of the first, second, third, and fourth pluralities of input IDT fingers has a width $L_j(0)$ on the propagation axis approximately equal to $(1/j)L_1(0)$, with $L_1(0)$ corresponding to a width of a finger of a corresponding first, second, third, and fourth plurality of input IDT fingers on the propagation axis closest to the focus of the dual-port transformer.

17. The dual-port transformer of claim 15, wherein each finger of the first, second, third, and fourth pluralities of input IDT fingers has a radius of curvature $R(z)$ substantially equal to $z(1+(z_0/z)^2)$, with z corresponding to a distance to the focus of the of the dual-port transformer and $z_0$ corresponding to a confocal parameter of the dual-port transformer.

18. A single-port filter comprising:
a phononic resonator, the phononic resonator including:
a piezoelectric layer including piezoelectric material;
a first phononic reflector at a first end of the piezoelectric layer; and
a second phononic reflector at a second end of the piezoelectric layer opposite the first end; and
a focusing interdigital transducer, the focusing interdigital transducer including:
a first plurality of IDT fingers formed on a top surface of the piezoelectric layer, each finger of the first plurality of IDT fingers being arc-shaped, a spacing between adjacent fingers of the first plurality of IDT fingers substantially equal to a predetermined length;
a first bus formed on the top surface of the piezoelectric layer and electrically connected to the first plurality of IDT fingers, the first bus adapted to receive a first polarity of an input signal, the first bus adapted to electrically distribute the first polarity of the input signal to the first plurality of input IDT fingers, the first bus adapted to transmit a first polarity of a filtered output signal;
a second plurality of IDT fingers formed on the top surface of the piezoelectric layer, each finger of the second plurality of IDT fingers being arc-shaped, a spacing between adjacent fingers of the second plurality of IDT fingers substantially equal to the predetermined length, a spacing between each finger of the second plurality of IDT fingers and a corresponding adjacent finger of the first plurality of IDT fingers substantially equal to half of the predetermined length;

a second bus formed on the top surface of the piezoelectric layer and electrically connected to the second plurality of IDT fingers, the second bus adapted to receive a second polarity of the input signal, the second bus adapted to electrically distribute the second polarity of the input signal to the second plurality of IDT fingers, the second bus adapted to transmit a second polarity of the filtered output signal;

a third plurality of IDT fingers formed on a bottom surface of the piezoelectric layer, each finger of the third plurality of IDT fingers being arc-shaped, a spacing between adjacent fingers of the third plurality of IDT fingers substantially equal to the predetermined length, each finger of the third plurality of IDT fingers opposite a corresponding finger of the first plurality of IDT fingers;

a third bus formed on the bottom surface of the piezoelectric layer and electrically connected to the third plurality of IDT fingers, the third bus electrically connected to the second bus, the third bus adapted to receive the second polarity of the input signal, the third bus adapted to electrically distribute the second polarity of the input signal to the third plurality of IDT fingers, the third bus adapted to transmit the second polarity of the filtered output signal;

a fourth plurality of IDT fingers formed on the bottom surface of the piezoelectric layer, each finger of the fourth plurality of IDT fingers being arc-shaped, a spacing between adjacent fingers of the fourth plurality of IDT fingers substantially equal to the predetermined length, a spacing between each finger of the fourth plurality of IDT fingers and a corresponding adjacent finger of the third plurality of IDT fingers substantially equal to half of the predetermined length, each finger of the fourth plurality of IDT fingers opposite a corresponding finger of the second plurality of IDT fingers;

a fourth bus formed on the bottom surface of the piezoelectric layer and electrically connected to the fourth plurality of IDT fingers, the fourth bus electrically connected to the first bus, the fourth bus adapted to receive the first polarity of the input signal, the fourth bus adapted to electrically distribute the first polarity of the input signal to the fourth plurality of IDT fingers, the fourth bus adapted to transmit the first polarity of the filtered output signal;

wherein the first, second, third, and fourth pluralities of IDT fingers define a focus on a propagation axis of the single-port filter, wherein when an operating frequency is a single frequency, the predetermined length is equal to an acoustic wavelength in the piezoelectric layer at the single frequency, wherein when the operating frequency is a first frequency and a second frequency, the predetermined length is biperiodic with a first period equal to an acoustic wavelength in the piezoelectric layer at the first frequency and a second period equal to an acoustic wavelength in the piezoelectric layer at the second frequency, wherein when the operating frequency is a band of frequencies between a lower frequency and an upper frequency, the predetermined length is chirped between a lower period equal to an acoustic wavelength in the piezoelectric layer at the lower frequency and an upper period equal to an acoustic wavelength in the piezoelectric layer at the upper frequency, wherein a $j^{th}$ finger of the first, second, third, and fourth pluralities of IDT fingers has a width $L_j(\theta)$ substantially equal to $L_j(0)e^{-\theta^2/\theta_D^2}$, with $L_j(0)$ corresponding to a width of the $j^{th}$ finger on the propagation axis of the single-port filter, $\theta$ corresponding to an angle from the propagation axis, and $\theta_D$ corresponding to a far field divergence angle of the single-port filter, and wherein the first, second, third, and fourth pluralities of IDT fingers are adapted to create Lamé waves in the piezoelectric layer.

19. The single-port filter of claim 18, wherein the $j^{th}$ finger of the first, second, third, and fourth pluralities of IDT fingers has a width $L_j(0)$ on the propagation axis approximately equal to $(1/j)L_1(0)$, with $L_1(0)$ corresponding to a width of a finger of a corresponding first, second, third, and fourth plurality of IDT fingers on the propagation axis closest to the focus of the single-port filter.

20. The single-port filter of claim 18, wherein each finger of the first, second, third, and fourth pluralities of IDT fingers has a radius of curvature $R(z)$ substantially equal to $z(1+(z_0/z)^2)$, with z corresponding to a distance to the focus of the of the single-port filter and $z_0$ corresponding to a confocal parameter of the single-port filter.

* * * * *